US00RE37962E

(19) United States
(12) Reissued Patent
Kondo et al.

(10) Patent Number: US RE37,962 E
(45) Date of Reissued Patent: Jan. 7, 2003

(54) PHOTOPOLYMERIZABLE COMPOSITION CONTAINING A SENSITIZING DYE AND A TITANOCENE COMPOUND

(75) Inventors: Syunichi Kondo, Shizuoka (JP); Kazuo Fujita, Shizuoka (JP)

(73) Assignee: Fuji Photo Film Co., Ltd., Minami-Ashigara (JP)

(21) Appl. No.: 09/621,541

(22) Filed: Jul. 21, 2000

Related U.S. Patent Documents

Reissue of:
(64) Patent No.: 5,700,849
Issued: Dec. 23, 1997
Appl. No.: 08/606,435
Filed: Feb. 23, 1996

(30) Foreign Application Priority Data

Feb. 28, 1995 (JP) ..... 7-039512

(51) Int. Cl.[7] ..... C08F 2/50; C08F 4/64; C08F 4/649; G03F 7/28

(52) U.S. Cl. ..... 522/16; 522/29; 522/24; 522/25; 522/26; 522/27; 522/28; 430/281.1

(58) Field of Search ..... 522/16, 29, 24, 522/25, 26, 27, 28; 430/281.1

(56) References Cited

U.S. PATENT DOCUMENTS

| | | | | | |
|---|---|---|---|---|---|
| 5,385,807 | A | * | 1/1995 | Okamoto et al. | 430/283 |
| 5,498,641 | A | * | 3/1996 | Urano et al. | 522/26 |
| 5,573,889 | A | * | 11/1996 | Hofmann et al. | 430/285.1 |
| 5,691,394 | A | * | 11/1997 | Kondo | 522/29 |
| 5,731,363 | A | * | 3/1998 | Okamoto et al. | 522/16 |
| 5,776,996 | A | * | 7/1998 | Okamoto et al. | 522/26 |

FOREIGN PATENT DOCUMENTS

| | | | | |
|---|---|---|---|---|
| EP | 747 771 | * | 12/1996 | G03F/7/29 |
| JP | 07-039511 | * | 9/1996 | G03F/7/31 |
| JP | 09-288354 | * | 11/1997 | G03F/7/29 |
| JP | 10-020494 | * | 1/1998 | C08F/2/48 |
| JP | 11-038618 | * | 2/1999 | C08K/5/56 |
| JP | 11-065114 | * | 3/1999 | C08F/2/50 |
| JP | 11-316459 | * | 11/1999 | G03F/7/27 |
| JP | 2001-042524 | * | 2/2001 | G03F/7/29 |

* cited by examiner

*Primary Examiner*—Cheryl Juska
(74) *Attorney, Agent, or Firm*—Burns, Doane, Swecker & Mathis, LLP

(57) ABSTRACT

A photopolymerizable composition is disclosed, which comprises an addition-polymerizable compound having at least one ethylenically unsaturated double bond, a sensitizing dye represented by the following formula (I):

(I)

wherein the all symbols are defined in the disclosure, and a titanocene compound.

6 Claims, No Drawings

PHOTOPOLYMERIZABLE COMPOSITION CONTAINING A SENSITIZING DYE AND A TITANOCENE COMPOUND

Matter enclosed in heavy brackets [ ] appears in the original patent but forms no part of this reissue specification; matter printed in italics indicates the additions made by reissue.

FIELD OF THE INVENTION

The present invention relates to a photopolymerizable composition, more particularly, it relates to a photopolymerizable composition highly sensitive to light rays in the visible light region and capable of showing good sensitivity also to $Ar^+$ laser, YAG-SHG laser or the like light source.

BACKGROUND OF THE INVENTION

A large number of image formation methods using a photopolymerization system have been conventionally known and used over a wide range of fields such as printing plate, printed circuit, paint, ink, hologram recording and three-dimensional formation. For example, there are known a method where a photopolymerizable composition comprising an addition-polymerizable compound having an ethylenic double bond and a photopolymerization initiator, further, if desired, an organic high molecular binder and a thermal polymerization inhibitor is provided on a support to form a film layer, the layer is imagewise exposed to a desired image to cure the exposed area by polymerization and then the unexposed area is removed by dissolution to form a cured relief image, a method where a layer comprising the above-described photopolymerizable composition is provided between two supports, with at least one support being transparent, the layer is imagewise exposed from the transparent support side to induce the change in adhesive strength by light and then the support is peeled off to form an image, a method where a photosensitive material having a layer containing microcapsules in which a photopolymerizable composition and a coloring material such as a leuco dye are encapsulated is prepared, and the photosensitive material is imagewise exposed to photocure the capsules on the exposed area, while the capsules on the unexposed area are ruptured by pressure or heat treatment to put their contents into contact with a coloring material developer to effect coloration, thereby forming a colored image, an image formation method using the change in toner adhesion property of the photopolymerizable composition due to light and an image formation method using the change in refractive index of the photopolymerizable composition.

The photopolymerizable composition applied to these methods uses in many cases benzyl, benzoin ether, Michler's ketone, anthraquinone, acridine, phenazine or benzophenone as a photopolymerization initiator. However, these photopolymerization initiators are extremely low in the photopolymerization initiation ability to visible light of 400 nm or more as compared with the photopolymerization initiation ability to ultraviolet light of 400 nm or less and accordingly, thus they are remarkably limited in their application range.

Recently, as the image formation technique has been developed, a photopolymer having high sensitivity to light rays in the visible region is being demanded. The photopolymer is, for example, a photosensitive material suitable for non-contact type plate-making using projection exposure or for plate-making using a visible light laser. The highly expected visible light laser includes an $Ar^+$ laser which emits light of 488 nm and a YAG-SHG laser which emits light of 532 nm.

With respect to the photopolymerization initiation system sensitive to light rays in the visible light region, many proposals have been hitherto made. Examples of the system include a certain kind of photosensitive dyes described in U.S. Pat. No. 2,850,445, a composite initiation system containing a dye and an amine (see, JP-B-44-20189 (the term "JP-B" as used herein means an "examined Japanese patent publication")), a combination system containing hexaarylbiimidazole, a radical generating agent and a dye (see, JP-B-45-37377), a system containing hexaarylbiimidazole and p-dialkylaminobenzylidene ketone (see, JP-B-47-2528 and JP-A-54-155292 (the term "JP-A" as used herein means an "unexamined published Japanese patent application")), a system containing a cyclic cis-α-dicarbonyl compound and a dye (see, JP-A-54-84183), a system containing a substituted triazine and a merocyanine dye (see, JP-A-54-151024), a system containing 3-ketocoumarin and an activator (see, JP-A-52-112681, JP-A-58-15503), a system containing biimidazole, a styrene derivative and a thiol (see, JP-A-59-140203), a system containing an organic peroxide and a dye (see, JP-A-59-140203, JP-A-59-189340) and a system containing a dye having a rhodanine skeleton and a radical generating agent (see, JP-A-2-244050).

It is described in JP-A-59-152396, JP-A-61-151197, JP-A-63-10602, JP-A-63-41484 and JP-A-3-12403 that the titanocene is effective as a photopolymerization initiator and examples of its combination system include a system containing titanocene and a 3-ketocoumarin dye (see, JP-A-63-221110), a system where titanocene, a xanthene dye and further, an addition-polymerizable ethylenically unsaturated compound containing an amino group or a urethane group are used in combination (see, JP-A-4-221958 and JP-A-4-219756) and a system containing titanocene and a specific merocyanine dye (see, JP-A-6-295061).

These conventional techniques are surely effective to visible light rays, however, they are bound to problems such that the sensitivity is insufficient or even if high sensitivity is achieved, the storage stability is poor and hence, these systems cannot be used in practice.

SUMMARY OF THE INVENTION

An object of the present invention is to provide a highly sensitive photopolymerizable composition, particularly, a photopolymerizable composition highly sensitive to visible light rays of 400 nm or more and to light of 488 nm or 532 nm corresponding to the output of an $Ar^+$ layer or YAG-SHG laser light source, respectively.

Another object of the present is to provide a photopolymerizable composition excellent in the storage stability.

As a result of intensive investigations to achieve the above-described objects, the present inventors have found that a combination system containing a dye having a specific structure and a titanocene compound capable of generating active radicals upon light irradiation in the presence of the sensitizing dye exhibits very high sensitivity to the visible light rays of 400 nm or more and is excellent in the storage stability and based on this finding, the present invention has been accomplished. According to the present invention, a photopolymerizable composition highly sensitive to light rays in the visible light region and excellent in the storage stability can be obtained.

More specifically, the present invention provides a photopolymerizable composition comprising an addition-polymerizable compound having at least one ethylenically unsaturated double bond, a sensitizing dye represented by the following formula (I) and a titanocene compound:

(I)

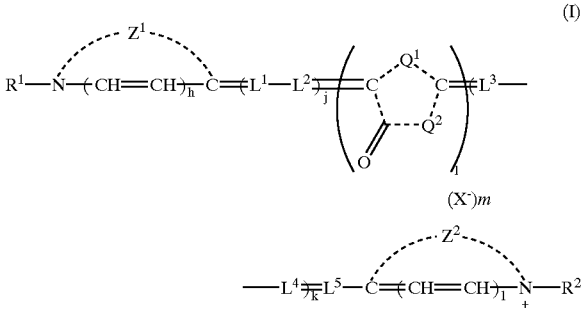

wherein $Z^1$ and $Z^2$ each represents a nonmetallic atom group necessary for forming a 5- and/or 6-membered nitrogen-containing heterocyclic ring usually used in cyanine dyes; $R^1$ and $R^2$ each represents an alkyl group; $Q^1$ and $Q^2$ represent in combination therewith an atomic group necessary for forming a 4-thiazolidinone ring, a 5-thiazolidinone ring, a 4-imidazolidinone ring, a 4-oxazolidinone ring, a 5-oxazolidinone ring, a 5-imidazolidinone ring or a 4-dithiolanone ring; $L^1$, $L^2$, $L^3$, $L^4$ and $L^5$ each represents a methine group; m represents 1 or 2; i and h each represents 0 or 1; l represents 1 or 2; j and k each represents 0, 1, 2 or 3; and $X^-$ represents a counter anion.

In one embodiment of the present invention, the photopolymerizable initiation system further contains at least one compound selected from the group consisting of the compounds 1) to 8):

1) a compound having a carbon-halogen bond;

2) a ketone compound represented by the following formula (II):

(II)

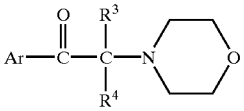

wherein Ar represents an aromatic group selected from those represented by the following formulae:

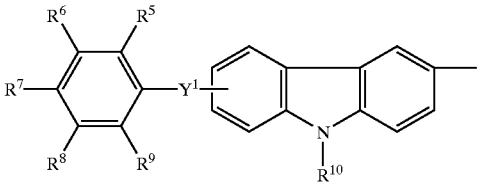

wherein $R^5$, $R^6$, $R^7$, $R^8$ and $R^9$, which may be the same or different, each represents a hydrogen atom, a halogen atom, an alkyl group, an alkenyl group, an aryl group, a substituted aryl group, a hydroxyl group, an alkoxy group, an —S—$R^{11}$ group, an —SO—$R^{11}$ group or an —$SO_2$—$R^{11}$ group, provided that at least one of $R^5$, $R^6$, $R^7$, $R^8$ and $R^9$ represents an —S—$R^{11}$ or —SO—$R^{11}$ group (wherein $R^{11}$ represents an alkyl group or an alkenyl group); $R^{10}$ represents a hydrogen atom, an alkyl group or an acyl group; and $Y^1$ represents a hydrogen atom or

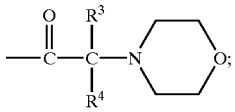

$R^3$ and $R^4$ each represents a hydrogen atom or an alkyl group and $R^3$ and $R^4$ may be combined with each other to represent an alkylene group;

3) a ketooxime compound represented by the following formula (III):

(III)

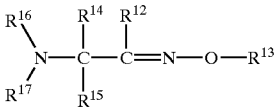

wherein $R^{12}$ and $R^{13}$, which may be the same or different, each represents a hydrocarbon group which may have a substituent and may contain an unsaturated bond or a heterocyclic group; $R^{14}$ and $R^{15}$, which may be the same or different, each represents a hydrogen atom, a hydrocarbon group which may have a substituent and may contain an unsaturated bond, a heterocyclic group, a hydroxyl group, a substituted oxy group, a mercapto group or a substituted thio group, and $R^{14}$ and $R^{15}$ may be combined with each other to form a ring and represent an alkylene group having from 2 to 8 carbon atoms which may contain —O—, —$NR^{16}$—, —O—CO—, —NH—CO—, —S— and/or —$SO_2$— in the linking main chain of the ring; and $R^{16}$ and $R^{17}$ each represents a hydrogen atom, a hydrocarbon group which may have a substituent and may contain an unsaturated bond or a substituted carbonyl group;

4) an organic peroxide;

5) a thio compound represented by formula (IV):

(IV)

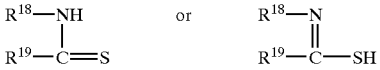

wherein $R^{18}$ represents an alkyl group, an aryl group or a substituted aryl group and $R^{19}$ represents a hydrogen atom or an alkyl group, or $R^{18}$ and $R^{19}$ may be combined with each other to represent a nonmetallic atom group necessary for forming a 5-, 6- or 7-membered ring which may contain a hetero atom selected from an oxygen atom, a sulfur atom and a nitrogen atom;

6) hexaarylbiimidazole;

7) an aromatic onium salt; and 8) a ketooxime ester.

DETAILED DESCRIPTION OF THE INVENTION

The present invention is described below in detail.

The polymerizable compound having an addition-polymerizable unsaturated bond of the present invention is selected from the compounds having at least one, preferably two or more terminal ethylenically unsaturated bonds. In other words, the compound has a chemical form such as a monomer, a prepolymer, namely, a dimer, a trimer or an oligomer, a mixture of these or a copolymer thereof. Examples of the monomer and the copolymer thereof include an ester of an unsaturated carboxylic acid (e.g., acrylic acid, methacrylic acid, itaconic acid, crotonic acid, isocrotonic acid, maleic acid) with an aliphatic polyhydric alcohol compound and an amide of an unsaturated carboxylic acid with an aliphatic polyamine compound.

Specific examples of the monomer of the ester of an aliphatic polyhydric alcohol compound with an unsaturated carboxylic acid include:

an acrylic ester, such as ethylene glycol diacrylate, triethylene glycol diacrylate, 1,3-butandiol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer;

a methacrylic ester, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl] dimethylmethane and bis[p-(methacryloxyethoxy)phenyl] dimethylmethane;

an itaconic ester, such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

a crotonic ester, such as ethylene glycol dicrotonate, tetramethylene glycol dicrotonate, pentaerythritol dicrotonate and sorbitol tetracrotonate;

an isocrotonic ester, such as ethylene glycol diisocrotonate, pentaerythritol diisocrotonate and sorbitol tetraisocrotonate;

a maleic ester, such as ethylene glycol dimaleate, triethylene glycol dimaleate, pentaerythritol dimaleate and sorbitol tetramaleate; and a mixture of these ester monomers.

Specific examples of the monomer of the amide of an aliphatic polyamine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Other examples include a vinylurethane compound having two or more polymerizable vinyl groups in one molecule resulting from adding a vinyl monomer having a hydroxyl group represented by the following formula (A) to a polyisocyanate compound having two or more isocyanate groups in one molecule as described in JP-B-48-41708:

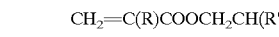

$$CH_2{=}C(R)COOCH_2CH(R')OH \quad (A)$$

(wherein R and R' each represents H or $CH_3$).

Further, polyfunctional acrylates and methacrylates such as urethane acrylates as described in JP-A-51-37193, polyester acrylates as described in JP-A-48-64183, JP-B-49-43191 and JP-B-52-30490 and epoxy acrylates resulting from reacting an epoxy resin with a (meth)acrylic acid are included. Also, those described in Nippon Secchaku Kyokaishi (Journal of the Adhesion Society of Japan), vol. 20, No. 7, pp. 300–308 (1984) as photo-curable monomers and oligomers may be used. The use amount of the compound is from 5 to 50% by weight (hereinafter simply referred to as "%"), preferably from 10 to 40%, based on the entire components.

A photopolymerization initiation system which is a second essential component of the photopolymerizable composition of the present invention is described below. The photopolymerization initiation system of the present invention comprises a combination of at least two kinds of components and the first component thereof is a sensitizing dye represented by formula (I).

Formula (I) is described below in detail.

The alkyl group represented by $R^1$ or $R^2$ is extended to a cyclic alkyl group, an unsaturated alkyl group, a branched alkyl group and a substituted alkyl group.

$R^1$ and $R^2$ is preferably an unsubstituted alkyl group having 18 or less carbon atoms (e.g., methyl, ethyl, propyl, butyl, pentyl, octyl, decyl, dodecyl, octadecyl). The cyclic alkyl group includes a cyclopropyl group, a cyclopentyl group and a cyclohexyl group.

The unsaturated alkyl group includes a vinyl group, a vinylmethyl group, a 2-butenyl group, a 3-butenyl group and a 3-hexenyl group.

The branched alkyl group includes an isobutyl group, a 4-methylpentyl group, and a 2-ethylhexyl group.

The substituted alkyl group is preferably an alkyl group having 18 or less carbon atoms substituted by a substituent, preferably a substituent such as a carboxyl group, a cyano group, a halogen atom (e.g., fluorine, chlorine, bromine), a hydroxyl group, an alkoxycarbonyl group having 8 or less carbon atoms (e.g., methoxycarbonyl, ethoxycarbonyl, phenoxycarbonyl, benzyloxycarbonyl), an alkoxy group having 8 or less carbon atoms (e.g., methoxy, ethoxy, benzyloxy, phenethyloxy), a monocyclic aryloxy group having 10 or less carbon atoms (e.g., phenoxy, p-tolyloxy), an acyloxy group having 8 or less carbon atoms (e.g., acetyloxy, propionyloxy), an acyl group having 8 or less carbon atoms (e.g., acetyl, propionyl, benzoyl, mesyl), a carbamoyl group (e.g., carbamoyl, N,N-dimethylcarbamoyl, morpholinocarbonyl, piperidinocarbonyl), a sulfamoyl group (e.g., sulfamoyl, N,N-dimethylsulfamoyl, morpholinosulfonyl, piperidinosulfonyl) and an aryl group having 10 or less carbon atoms (e.g., phenyl, 4-chlorophenyl, 4-methylphenyl, α-naphthyl).

$Z^1$ and $Z^2$ each represents a nonmetallic atom group necessary for forming a 5- or 6-membered nitrogen-containing heterocyclic ring and preferred examples of the ring include a thiazole nucleus (e.g., thiazole, 4-methylthiazole, 4-phenylthiazole, 5-methylthiazole, 5-phenylthiazole, 4,5-dimethylthiazole, 4,5-diphenylthiazole, 4-(2-thienyl)thiazole), a benzothiazole nucleus (e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5,6-dimethylbenzothiazole, 5-bromobenzothiazole, 6-bromobenzothiazole, 5-iodobenzothiazole, 5-trifluoromethylbenzothiazole, 5-phenylbenzothiazole, 4-methoxybenzothiazole, 5-methoxybenzothiazole, 6-methoxybenzothiazole, 5-carboxybenzothiazole, 5-cyanobenzothiazole, 5-fluorobenzothiazole, 5-ethoxybenzothiazole, tetrahydrobenzothiazole, 5,6-dimethoxybenzothiazole, 5-hydroxybenzothiazole, 6-hydroxybenzothiazole, 5,6-dihydroxybenzothiazole), a naphthothiazole nucleus (e.g., naphtho[1,2-d]thiazole, naphtho[2,1-d]thiazole, naphtho[2,3-d]thiazole, 5-methoxynaphtho[2,1-d]thiazole, 5-ethoxynaphtho[2,1-d]thiazole, 8-methoxynaphtho[1,2-d]thiazole, 7-methoxynaphtho[1,2-d]thiazole, 8,9-dihydronaphtho[1,2-d]thiazole), an oxazole nucleus (e.g., 4-methyloxazole, 5-methyloxazole, 4-phenyloxazole, 4,5-diphenyloxazole, 4-ethyloxazole, 4,5-dimethyloxazole, 5-phenyloxazole), a benzoxazole nucleus (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 5-methoxybenzoxazole, 5-ethoxybenzoxazole, 5-fluorobenzoxazole, 6-methoxybenzoxazole, 5-hydroxybenzoxazole, 6-hydroxybenzoxazole), a naphthoxazole nucleus (e.g., naphth[1,2-d]oxazole, naphth[2,1-d]oxazole, naphth[2,3-d]oxazole), a selenazole nucleus (e.g., selenazole, 4-methylselenazole, 4-phenylselenazole, 4,5-diphenylselenazole), a benzoselenazole nucleus (e.g., benzoselenazole, 5-chlorobenzoselenazole, 5-methylbenzoselenazole, 5-methoxybenzoselenazole, 5-phenylbenzoselenazole), a naphthoselenazole nucleus (e.g., naphtho[1,2-d]selenazole, naphtho[1,2-d]selenazole, naphtho[2,3-d]selenazole), a tellurazole nucleus (e.g., benzotellurazole, 5-methylbenzotellurazole, 5,6-dimethylbenzotellurazole, naphtho[1,2-d]tellurazole, naphtho[2,1-d]tellurazole, naphtho[2,3-d]tellurazole, 6-methoxynaphtho[1,2-d]tellurazole), a thiazoline nucleus (e.g., thiazoline, 4-methylthiazoline, 4-phenylthiazoline), an oxazoline nucleus (e.g., 5,5-dimethyloxazoline), an isooxazole nucleus (e.g., 5-methylisooxazole), a benzoisooxazole nucleus (e.g., benzoisooxazole), a 3,3-dialkylindolenine nucleus (e.g., 3,3-dimethylindolenine, 3,3,5-trimethylindolenine, 5-chloro-3,3-dimethylindolenine, 5-ethoxycarbonyl-3,3-dimethylindolenine, 4,5-benzo-3,3-dimethylindolenine, 6,7-benzo-3,3-dimethylindolenine), a 2-pyridine nucleus (e.g., pyridine, 5-methylpyridine), a 4-pyridine nucleus (e.g., pyridine), a 2-quinoline nucleus (e.g., 6-ethoxyquinoline, 6-ethylquinoline, 6-chloroquinoline, 8-fluoroquinoline), a 4-quinoline nucleus (e.g., 8-methylquinoline, 8-fluoroquinoline, 6-chloroquinoline), a 1-isoquinoline nucleus (e.g., isoquinoline), a naphthylidine nucleus (e.g., 7-methyl-1,8-naphthylidine, 8-methyl-1,5-naphthylidine), a tetrazole nucleus (e.g., methyltetrazole, ethyltetrazole, phenyltetrazole), an imidazo[4,5-b]quinoxaline nucleus (e.g., 1-ethylimidazo[4,5-b]quinoxaline, 1-methylimidazo[4,5-b]-quinoxaline, 1-phenylimidazo[4,5-b]quinoxaline, 1-(2-methoxyethyl)imidazo[4,5-b]quinoxaline, 6-chloro-1-butylimidazo[4,5-b]quinoxaline) and a 4,9-dioxo-4,9-dihydronaphtho[2,3-d]imidazole nucleus (e.g., 1-butyl-4,9-dioxonaphtho[2,3-d]imidazole, 1-(2-methylpropyl)-4,9-dioxonaphtho[2,3-d]imidazole).

$L^1$, $L^2$, $L^3$, $L^4$ and $L^5$ each represents a methine group (including a substituted methine group and a group where a ring is formed on the methine chain) and preferred examples of the substituent include an alkyl group having from 1 to 4 carbon atoms (e.g., methyl, ethyl, propyl, butyl), an aryl group having from 6 to 10 carbon atoms (e.g., phenyl, 2-carboxyphenyl, 4-methylphenyl, 2-chlorophenyl), a substituted alkyl group having from 1 to 9 carbon atoms (e.g., chloromethyl, benzyl, 2-phenylethyl, 3-phenylpropyl, methoxyethyl), an alkoxy group having from 1 to 6 carbon atoms (e.g., methoxy, ethoxy, butoxy, hexyloxy) and an aryloxy group having from 6 to 12 carbon atoms (e.g., phenoxy, 4-chlorophenoxy, 4-methylphenoxy, naphthoxy). The substituents of $L^1$, $L^2$, $L^3$, $L^4$ and $L^5$ may also be preferably combined with each other to form a 5- or 6-membered ring on the methine chain.

It is further preferred to combine the substituents of $L^1$ and $L^2$ with $R^1$ and/or the substituents of $L^3$, $L^4$ and $L^5$ with $R^2$, thereby forming a 5- or 6-membered ring.

$X^-$ includes various anions, for example, $SO_4^{2-}$, $S_2O_3^{2-}$, $SO_3^-$, halogen ions, $ClO_4^-$, $BF_4^-$, $PF_6^-$, $SbF_6^-$, $BiCl_5^-$, $AsF_6^-$, $SbCl_6^-$, $SnCl_6^-$, $R—SO_3^-$ and $R—COO^-$ (wherein R represents a hydrogen atom, an alkyl group, an aryl group or a heterocyclic group).

Specific examples of the compound represented by formula (I) of the present invention are set forth below but the present invention is by no means limited thereto.

| | | MeOH $\lambda_{max}$ (nm) |
|---|---|---|
| (ii)-1 | 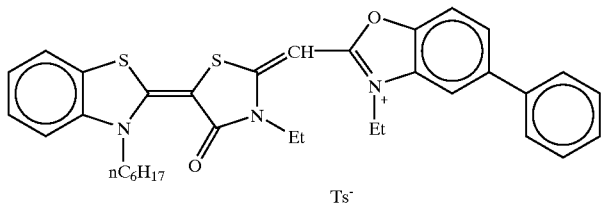 | 488 |
| (ii)-2 | 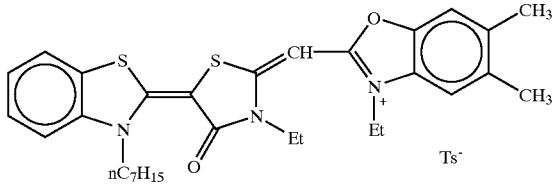 | 487 |

-continued
| | | MeOH $\lambda_{max}$ (nm) |
|---|---|---|
| (ii)-3 | 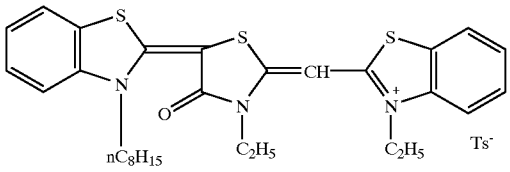 | 500 |
| (ii)-4 | 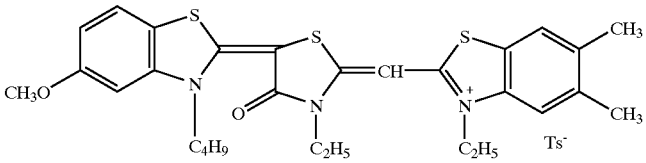 | 503 |
| (ii)-5 | 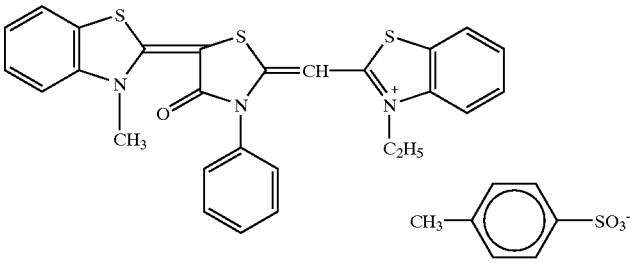 | 501 |
| (ii)-6 | 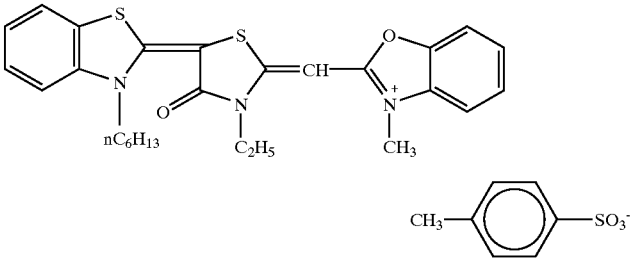 | 484 |
| (ii)-7 | 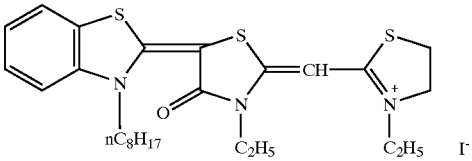 | 473 |
| (ii)-8 | 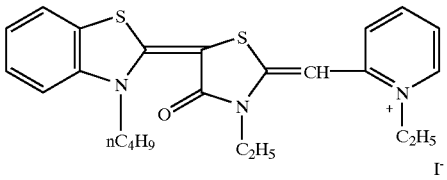 | 494 |
| (ii)-9 | 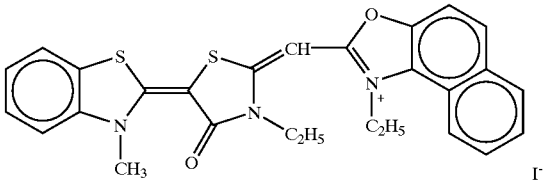 | 492 |

-continued
| | | MeOH $\lambda_{max}$ (nm) |
|---|---|---|
| (ii)-10 | 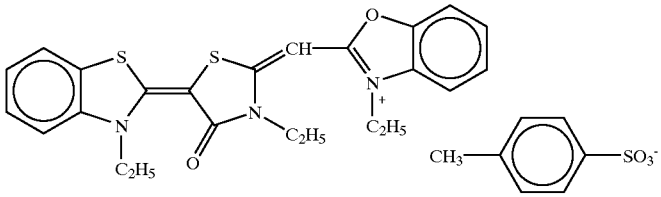 | 484 |
| (ii)-11 | 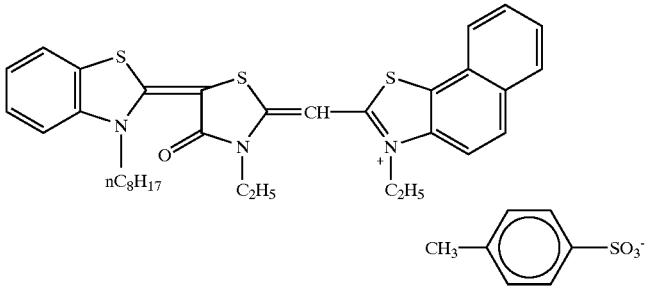 | 511 |
| (ii)-12 | 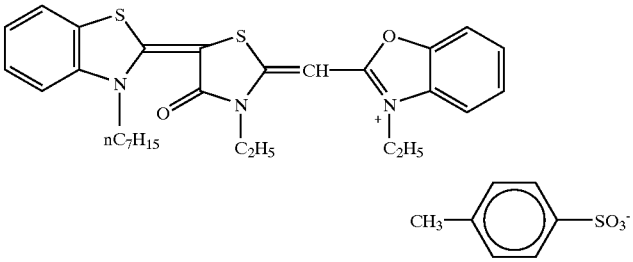 | 485 |
| (ii)-13 | 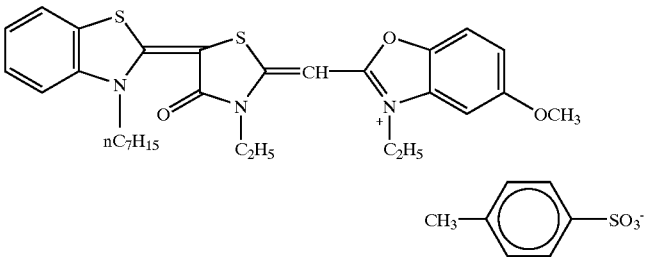 | 489 |
| (ii)-14 | 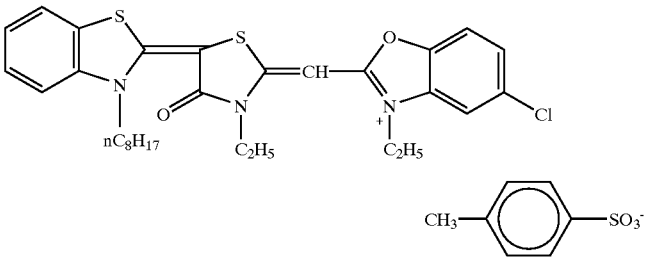 | 489 |

-continued
| | | MeOH $\lambda_{max}$ (nm) |
|---|---|---|
| (ii)-15 | 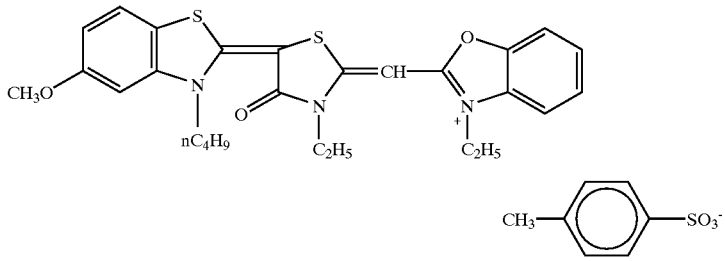 | 491 |
| (ii)-16 | 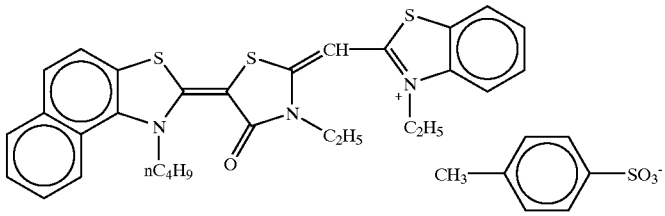 | 516 |
| (ii)-17 | 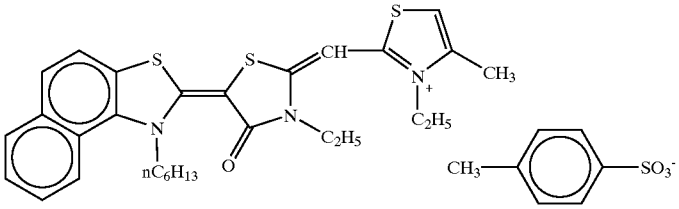 | 495 |
| (ii)-18 | 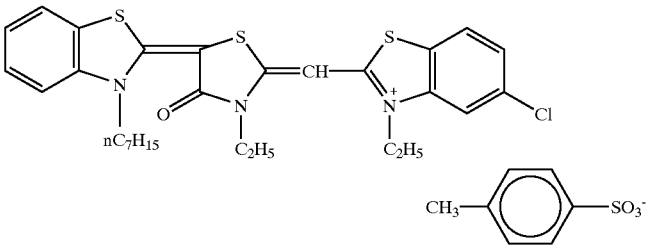 | 505 |
| (ii)-19 | 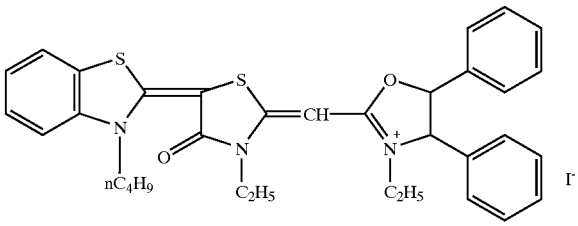 | 482 |
| (ii)-20 | 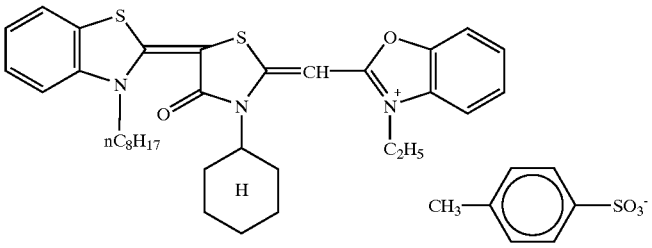 | 488 |

-continued
| | | MeOH $\lambda_{max}$ (nm) |
|---|---|---|
| (ii)-21 | 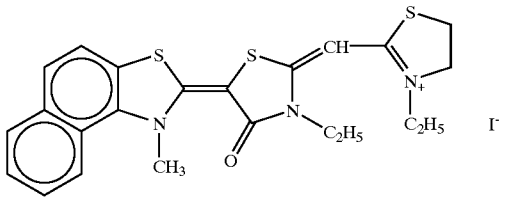 | 488 |
| (ii)-22 | 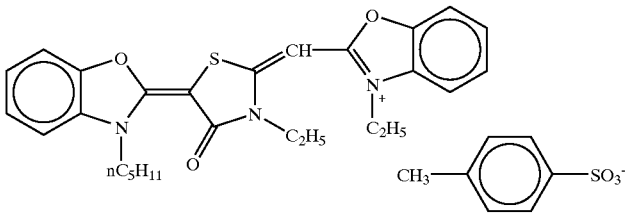 | 465 |
| (ii)-23 | 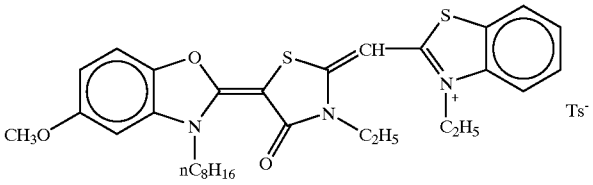 | 485 |
| (ii)-24 | 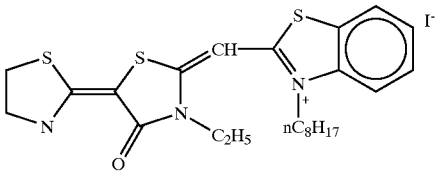 | 470 |
| (ii)-25 | 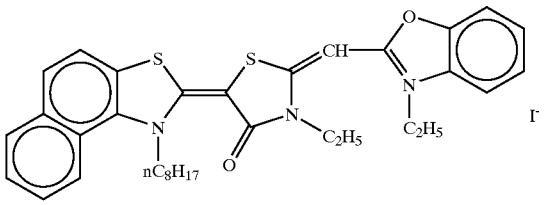 | 502 |
| (ii)-26 | 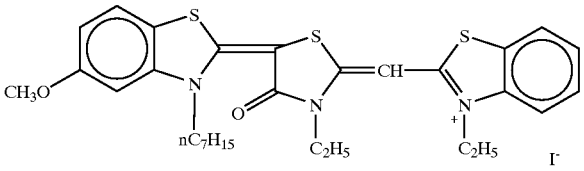 | 508 |
| (ii)-27 | 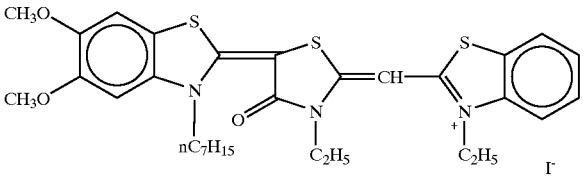 | 518 |

-continued
| | | MeOH $\lambda_{max}$ (nm) |
|---|---|---|
| (ii)-28 | 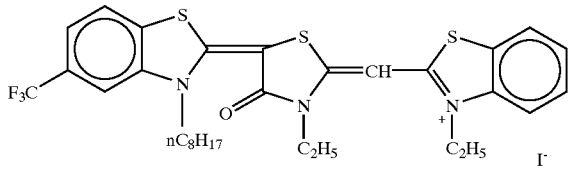 | 495 |
| (ii)-29 | 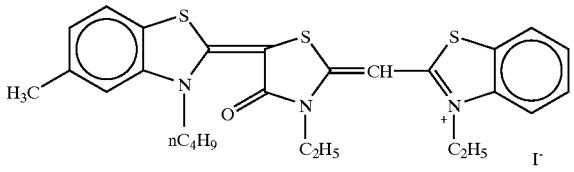 | 504 |
| (ii)-30 | 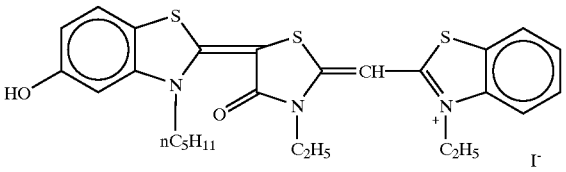 | 510 |
| (ii)-31 | 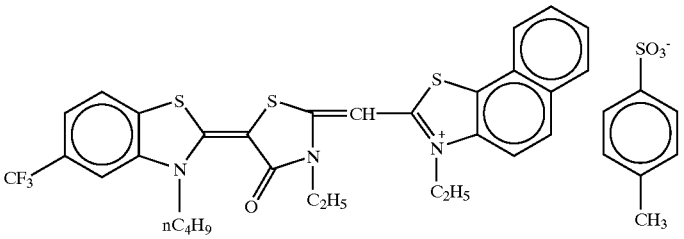 | 508 |
| (ii)-32 | 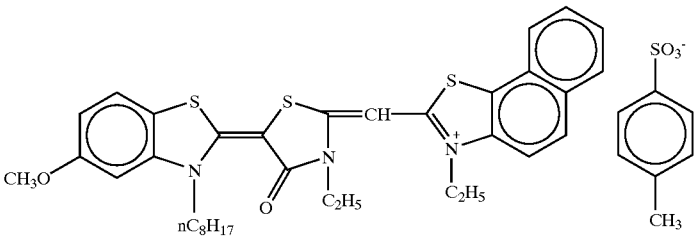 | 516 |
| (ii)-33 | 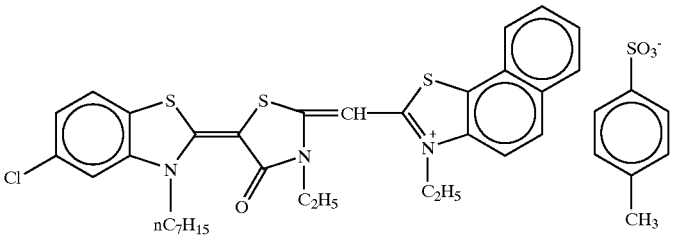 | 510 |
| (ii)-34 | 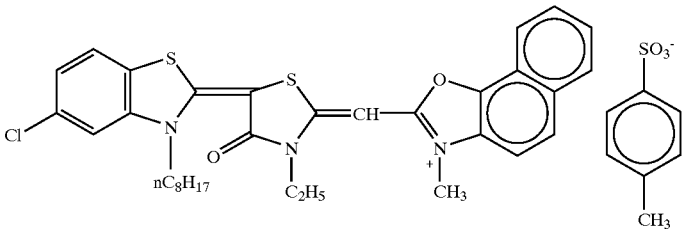 | 495 |

-continued
| | | MeOH $\lambda_{max}$ (nm) |
|---|---|---|
| (ii)-35 | 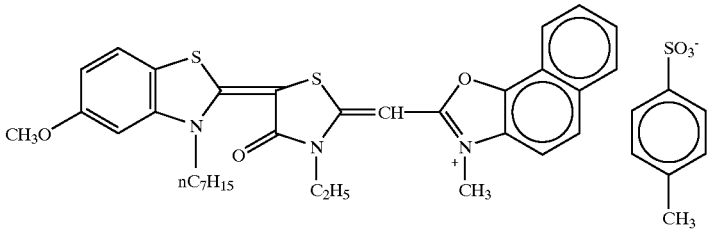 | 502 |
| (ii)-36 | 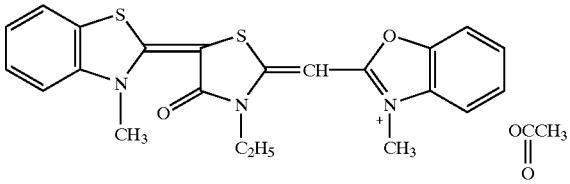 | 486 |
| (ii)-37 | 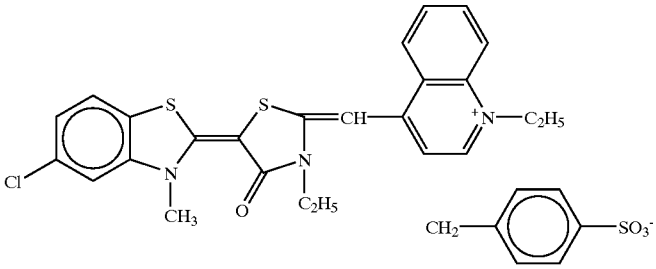 | 564 |
| (ii)-38 | 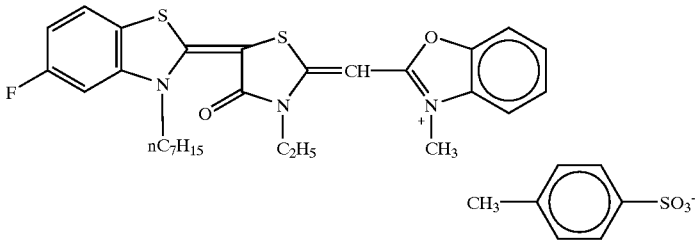 | 484 |
| (ii)-39 | 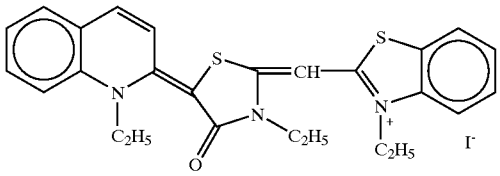 | 543 |
| (ii)-40 | 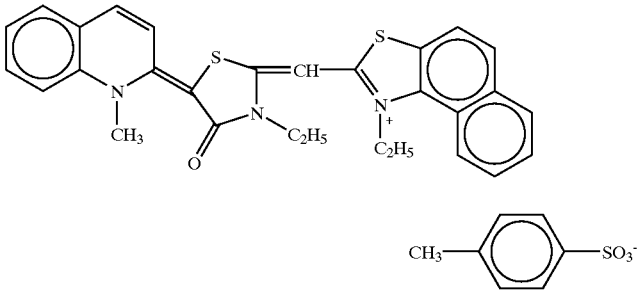 | 550 |

-continued
| | | MeOH $\lambda_{max}$ (nm) |
|---|---|---|
| (ii)-41 | 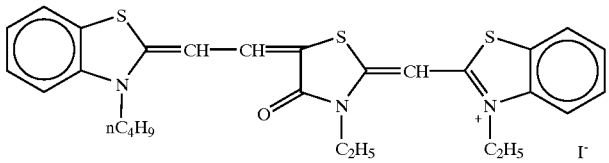 | 594 |
| (ii)-42 | 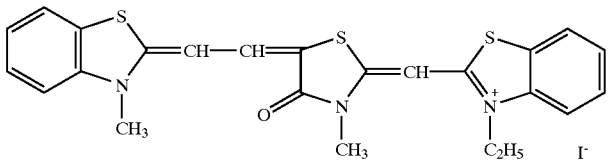 | 595 |
| (ii)-43 | 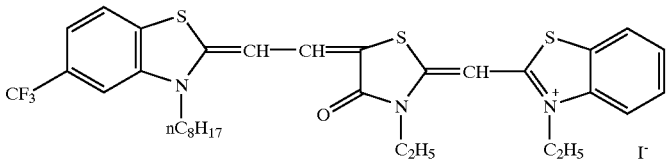 | 584 |
| (ii)-44 | 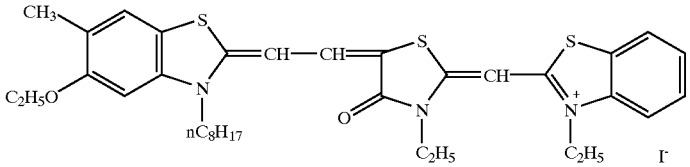 | 615 |
| (ii)-45 | 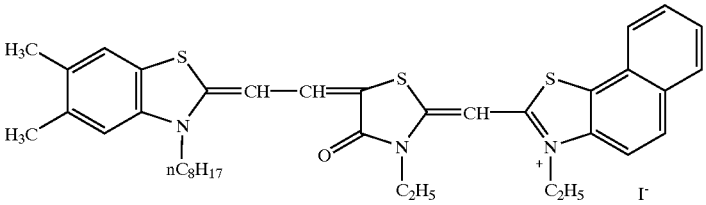 | 613 |
| (ii)-46 | 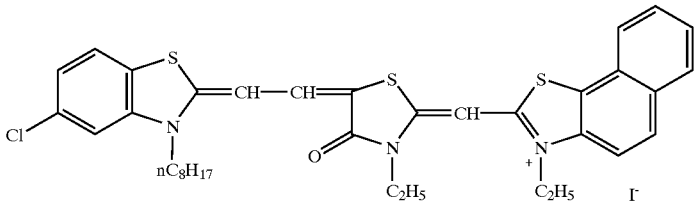 | 599 |
| (ii)-47 | 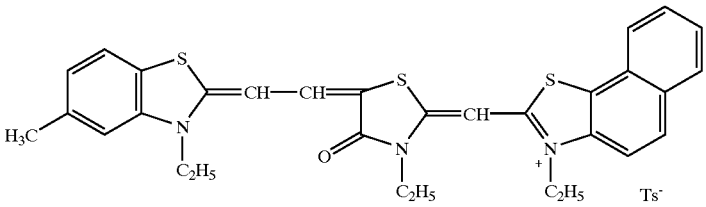 | 608 |

-continued
| | | MeOH $\lambda_{max}$ (nm) |
|---|---|---|
| (ii)-48 | 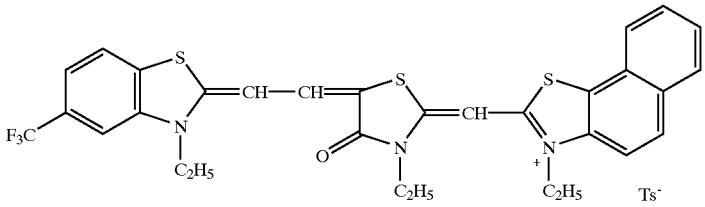 | 591 |
| (ii)-49 | 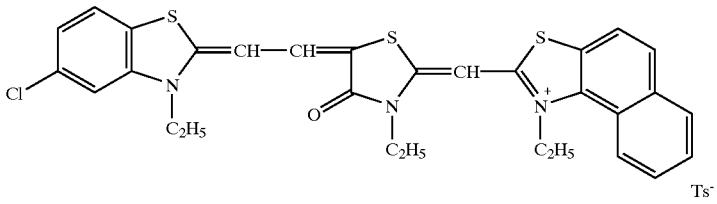 | 596 |
| (ii)-50 | 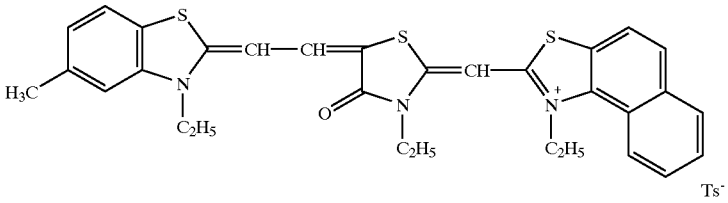 | 605 |
| (ii)-51 | 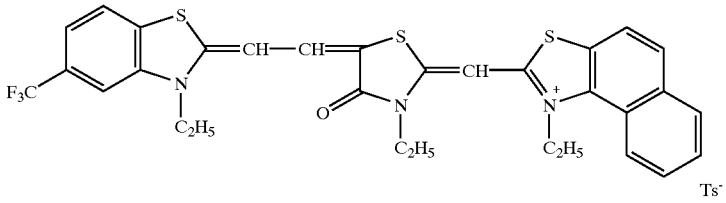 | 588 |
| (ii)-52 | 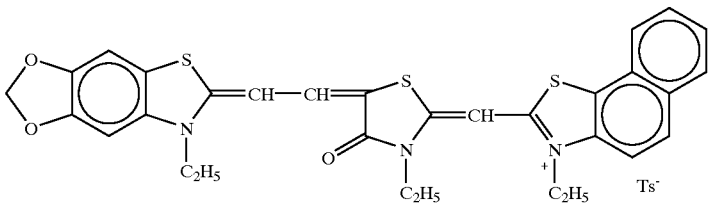 | 625 |
| (ii)-53 | 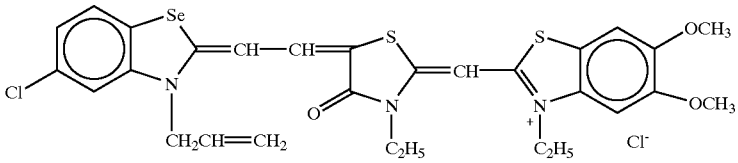 | 604 |
| (ii)-54 | 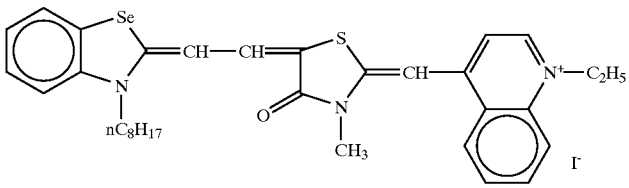 | 624 |

-continued
| | | MeOH $\lambda_{max}$ (nm) |
|---|---|---|
| (ii)-55 | 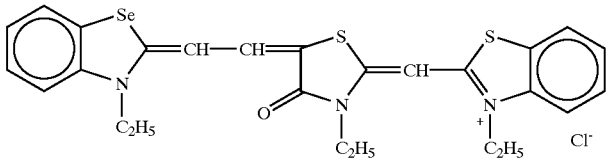 | 605 |
| (ii)-56 | 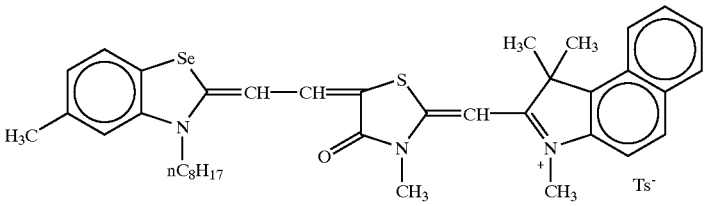 | 611 |
| (ii)-57 | 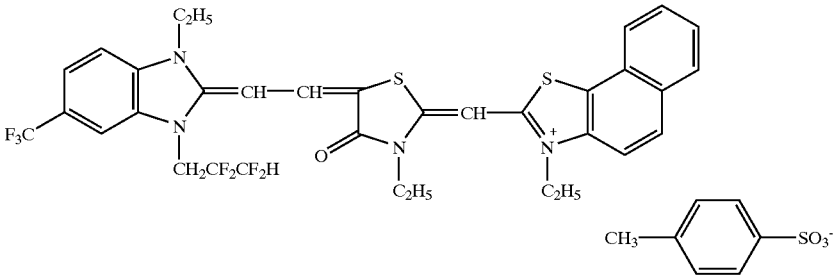 | 590 |
| (ii)-58 | 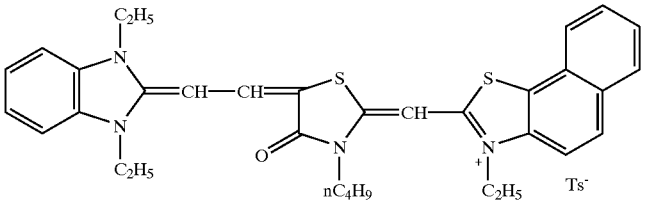 | 587 |
| (ii)-59 | 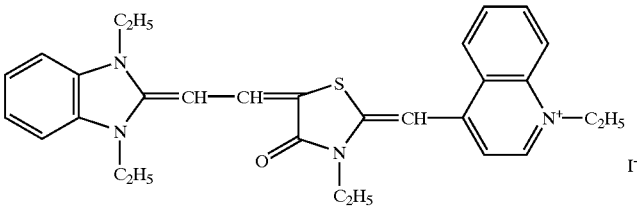 | 654 |
| (ii)-60 | 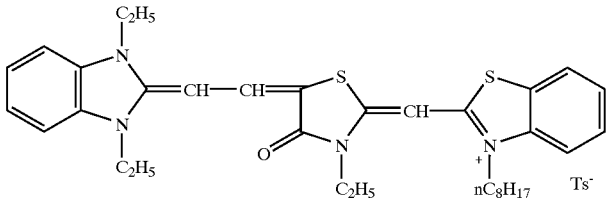 | 577 |

-continued
| | | MeOH $\lambda_{max}$ (nm) |
|---|---|---|
| (ii)-61 | 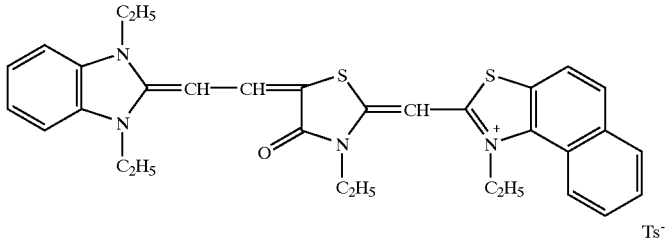 | 586 |
| (ii)-62 | 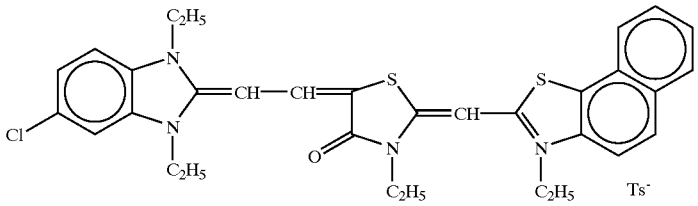 | 592 |
| (ii)-63 | 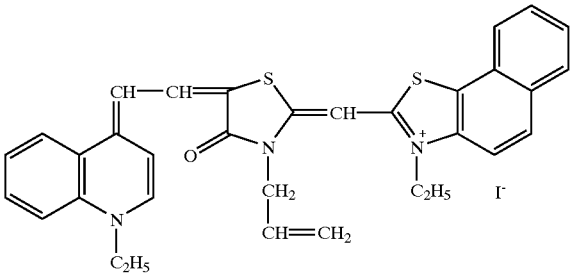 | 678 |
| (ii)-64 | 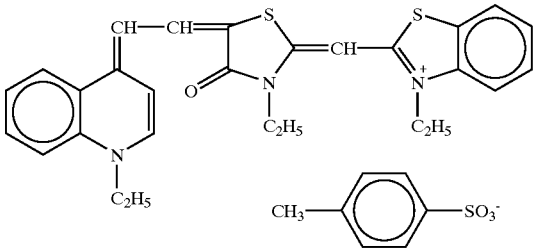 | 671 |
| (ii)-65 | 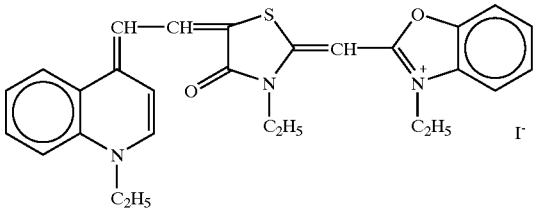 | 659 |
| (ii)-66 | 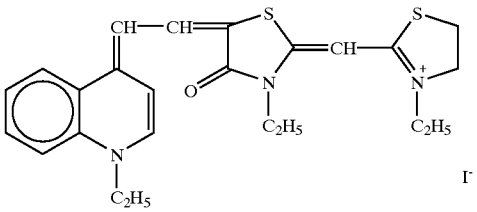 | 615 |

-continued
| | | MeOH $\lambda_{max}$ (nm) |
|---|---|---|
| (ii)-67 | 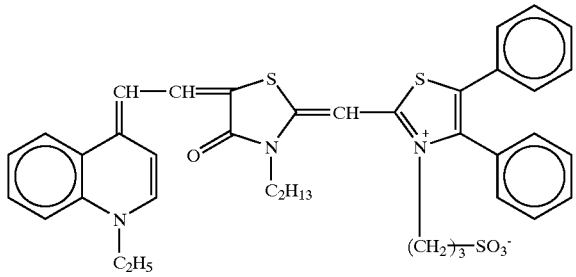 | 671 |
| (ii)-68 | 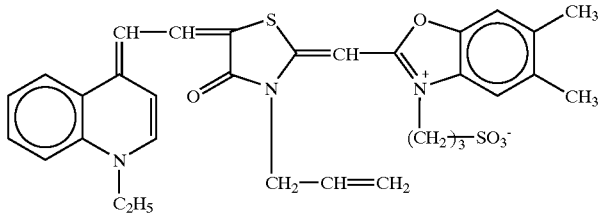 | 661 |
| (ii)-69 | 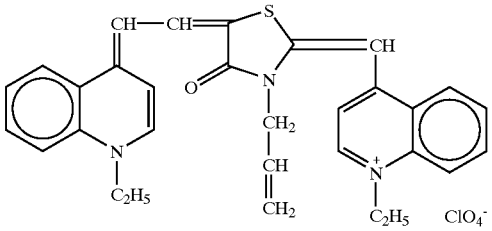 | 616 |
| (ii)-70 | 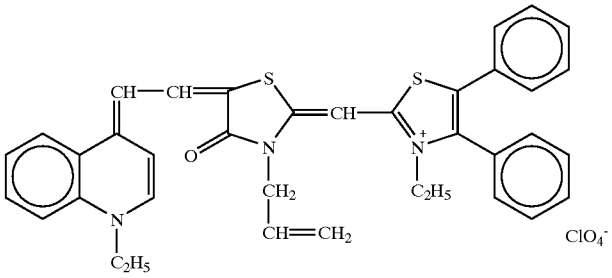 | 668 |
| (ii)-71 | 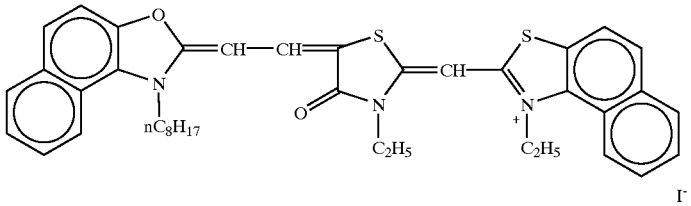 | 587 |
| (ii)-72 | 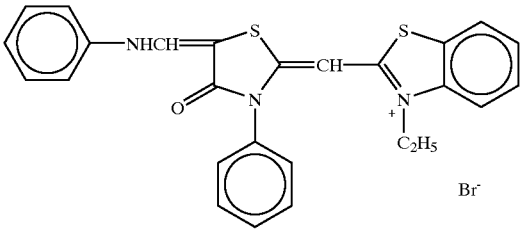 | 480 |

-continued
| | | MeOH $\lambda_{max}$ (nm) |
|---|---|---|
| (ii)-73 | 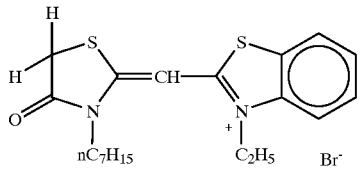 | 390 |
| (ii)-74 | 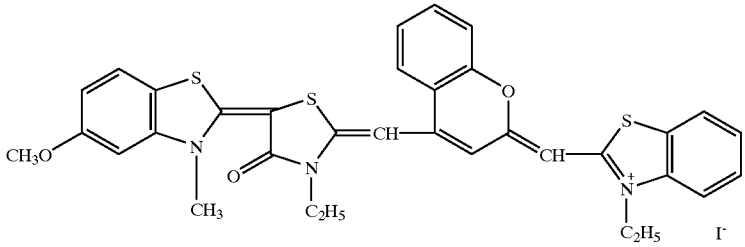 | 658 |
| (ii)-75 | 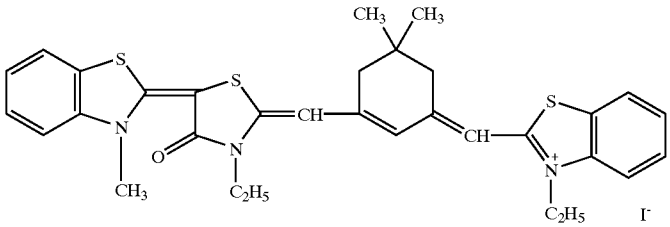 | 706 |
| (ii)-76 | 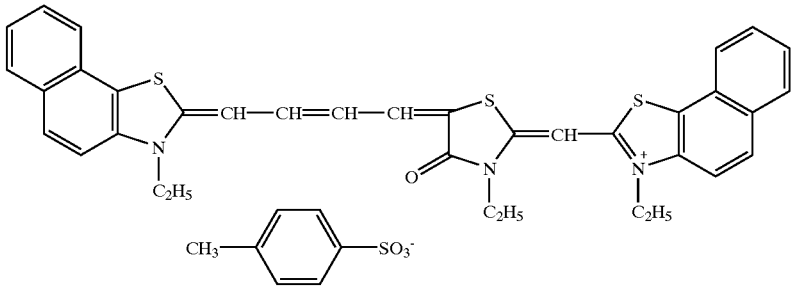 | 711 |
| (ii)-77 | 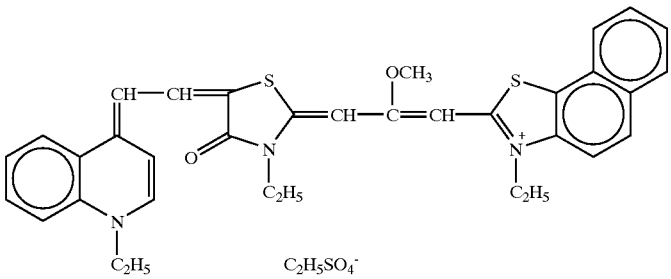 | 716 |

-continued

| | | MeOH $\lambda_{max}$ (nm) |
|---|---|---|
| (ii)-78 | 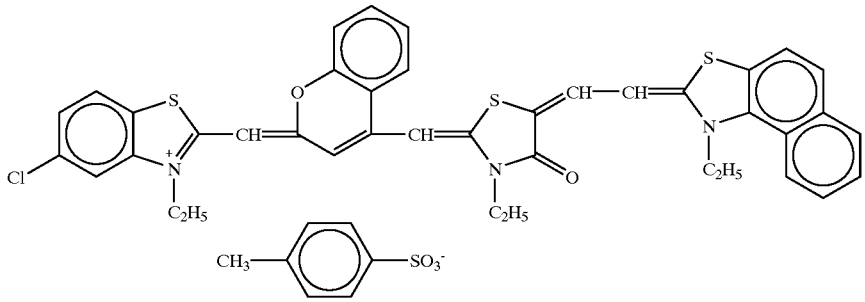 | 734 |
| (ii)-79 | 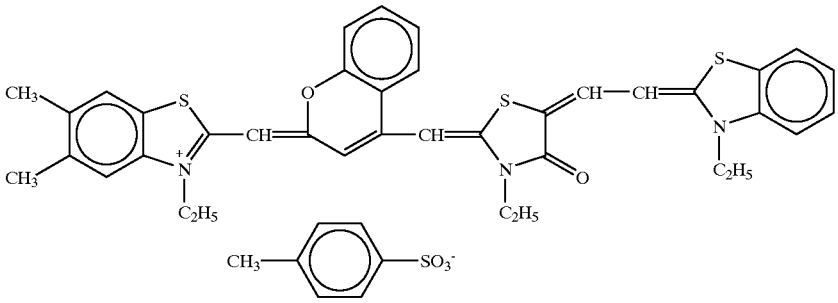 | 702 |
| (ii)-80 | 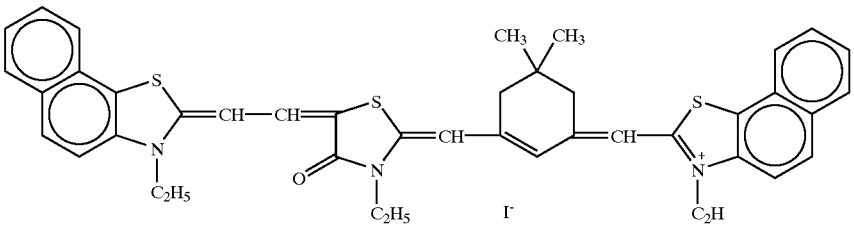 | 767 |
| (ii)-82 | 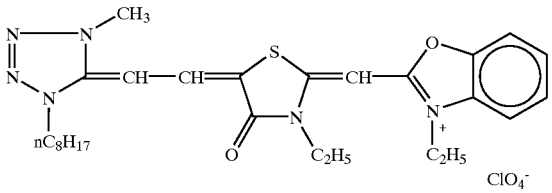 | 534 |
| (ii)-83 | 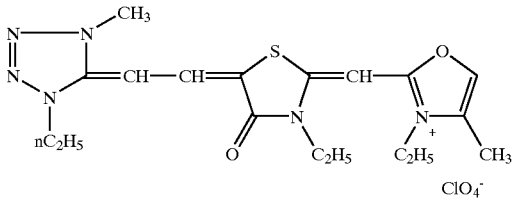 | 486<br>505 |

The sensitizing dyes represented by formula (I) for use in the photopolymerizable composition of the present invention may be suitably used individually or in combination of two or more thereof.

The titanocene compound which is important in the photopolymerization initiation system of the present invention is described below. The titanocene compound for use in the present invention may be appropriately selected from known compounds described, for example, in JP-A-59-152396 and JP-A-61-151197 as long as the compound is a titanocene compound capable of generating active radicals upon light irradiation in the presence of the above-described sensitizing dye together.

More specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl (hereinafter referred to as A-1), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl (hereinafter referred to as A-2), dimethylcylopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pyr-1-yl) phenyl)titanium (hereinafter referred to as A-3).

The titanocene compounds for use in the photopolymerizable composition of the present invention may be used individually or in combination of two or more thereof.

With respect to the use amount of the above-described sensitizing dye and titanocene compound constituting the photopolymerization initiation system for use in the photopolymerizable composition of the present invention, it is suitable to use the sensitizing dye in an amount of from 0.05 to 30, preferably from 0.1 to 20, more preferably from 0.2 to 10 parts by weight, and the titanocene compound in an amount of from 0.5 to 100, preferably from 1 to 80, more preferably from 2 to 50 parts by weight, each per 100 parts by weight of the ethylenic compound.

The photopolymerizable composition of the present invention may contain, in addition to the above-described sensitizing dye and the titanocene compound, compounds 1) to 8) which will be described below, for the purpose of increasing the sensitivity.

Compound 1) having a carbon-halogen bond is preferably a compound represented by the following formula (V), (VI), (VII), (VIII), (IX), (X) or (XI):

A compound represented by formula (V):

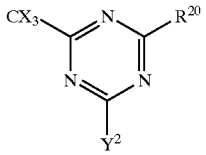

(V)

wherein X represents a halogen atom, $Y^2$ represents —$CX_3$, —$NH_2$, —$NHR^{21}$, —$NR^{21}{}_2$ or —$OR^{21}$ (wherein $R^{21}$ represents an alkyl group, a substituted alkyl group, an aryl group or a substituted aryl group), and $R^{20}$ represents —$CX_3$, an alkyl group, a substituted alkyl group, an aryl group, a substituted aryl group or a substituted alkenyl group;

A compound represented by formula (VI):

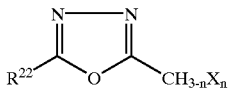

(VI)

wherein $R^{22}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; X represents a halogen atom; and n represents an integer of from 1 to 3;

A compound represented by formula (VII):

$$R^{23}—Z^3—CH_{2-m}X_m—R^{24} \quad (VII)$$

wherein $R^{23}$ represents an aryl group or a substituted aryl group; $R^{24}$ represents —CO—$NR^{25}R^{26}$ (wherein $R^{25}$ and $R^{26}$ each represents an alkyl group, a substituted alkyl group, an alkenyl group, a substituted alkenyl group, an aryl group or a substituted aryl group).

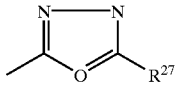

(wherein $R^{27}$ has the same meaning as $R^{23}$ in formula (VI)) or a halogen; $Z^3$ represents —CO—, —CS— or —$SO_2$—; and m represents 1 or 2;

A compound represented by formula (VIII):

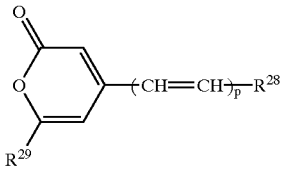

(VIII)

wherein $R^{28}$ represents an aryl or heterocyclic group which may be substituted; $R^{29}$ represents a trihaloalkyl or trihaloalkenyl group having from 1 to 3 carbon atoms; and p represents 1, 2 or 3;

A carbonylmethylene heterocyclic compound having a trihalogenomethyl group represented by formula (IX):

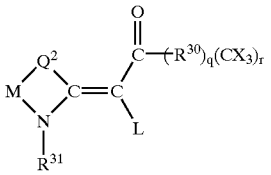

(IX)

wherein L represents a hydrogen atom or a substituent represented by the formula: CO—$(R^{30})_n(CX_3)_m$; M represents a substituted or unsubstituted alkylene group; $Q^2$ represents a sulfur atom, a selenium atom, an oxygen atom, a dialkylmethylene group, an alken-1,2-ylene group, a 1,2-phenylene group or an N—$R^{31}$ group; M and $Q^2$ may be combined to form a 3-or 4-membered heterocyclic ring; $R^{31}$ represents an alkyl group, an aralkyl group or an alkoxyalkyl group; $R^{30}$ represents a carbocyclic or heterocyclic aromatic group; X represents a chlorine, bromine or iodine atom; and q=0 and r=1, or q=1 and r=1 or 2;

A 4-halogeno-5-(halogenomethylphenyl)oxazole derivative represented by formula (X):

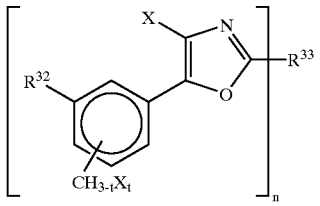

(X)

wherein X represents a halogen atom; t represents an integer of from 1 to 3; s represents an integer of from 1 to 4; $R^{32}$ represents a hydrogen atom or a $CH_{3-t}X_t$ group; and $R^{33}$ represents an s-valent unsaturated organic group which may be substituted; or A 2-(halogenomethylphenyl)-4-halogenooxazole derivative represented by formula (XI):

(XI)

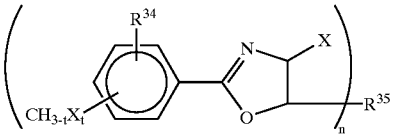

wherein X represents a halogen atom; v represents an integer of from 1 to 3; u represents an integer of from 1 to 4; $R^{34}$ represents a hydrogen atom or a $CH_{3-v}X_v$ group; and $R^{35}$ represents a u-valent unsaturated organic group which may be substituted.

Examples of the above described compounds having a carbon-halogen bond include:

Compounds described in Wakabayashi et. al, Bull. Chem. Soc. Japan, 42, 2924 (1969) such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-2-n-nonyl-4,6-bis(trichloromethyl)-S-triazine and 2-(α,α,β-trichloroethyl)4,6-bis(trichloromethyl)-S-triazine;

Compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

Compounds described in JP-A-53-133428 such as 2-(4-methoxynaphtho-1-yl)-4,6-bistrichloromethyl-S-triazine, 2-(4-ethoxynaphtho-1-yl)-4,6-bistrichloromethyl-S-triazine, 2-[4-(2-ethoxyethyl)-naphtho-1-yl]-4,6-bistrichloromethyl-S-triazine, 2-(4,7-dimethoxynaptho-1-yl]-4,6-bistrichloromethyl-S-triazine and 2-(acenaphtho-5-yl)-4,6-bistrichloromethyl-S-triazine;

Compounds described in German Patent 3,337,024, for example, as set forth below:

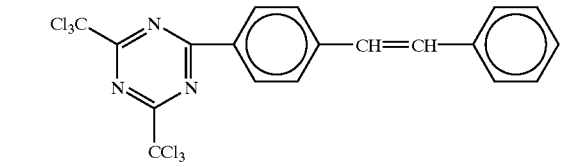

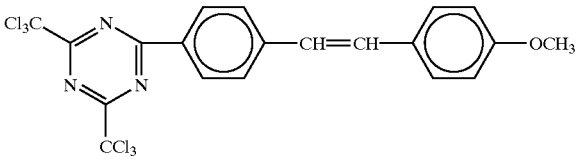

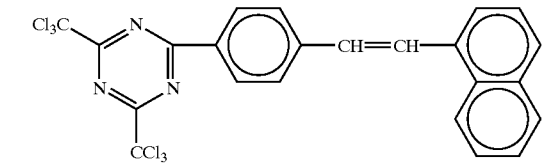

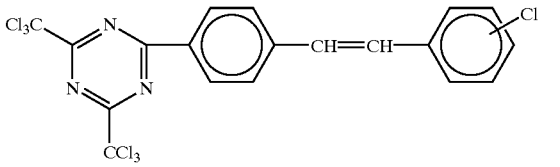

-continued

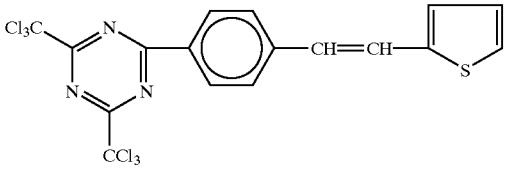

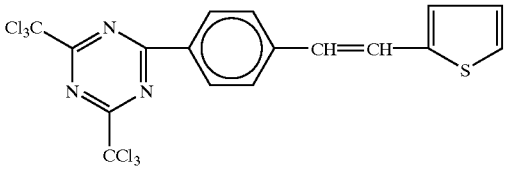

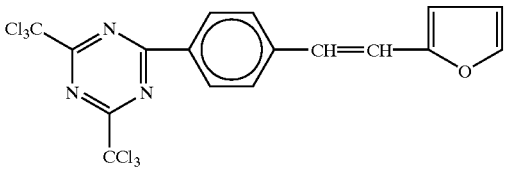

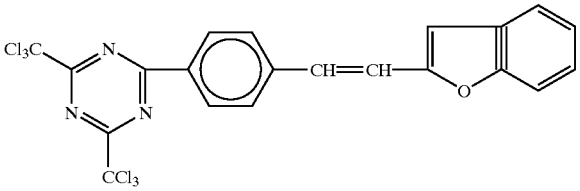

Compounds described in F. C. Schaefer et al, J. Org. Chem., 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine;

Compounds described in JP-A-62-58241, for example, as set forth below:

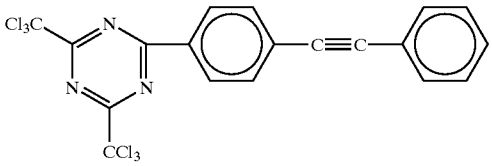

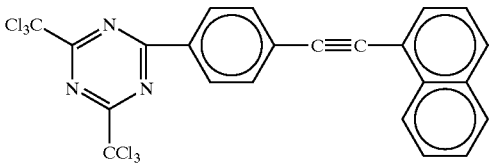

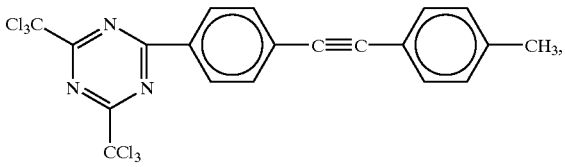

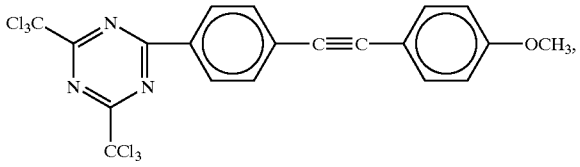

-continued
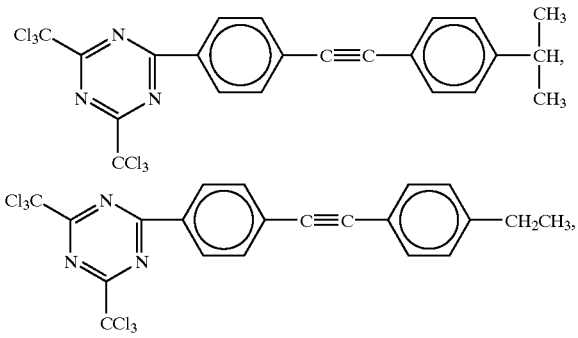
Compounds described in JP-A-5-281728, for example, as set forth below:
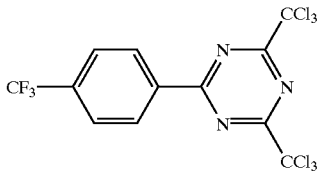
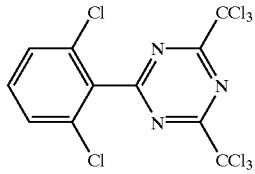
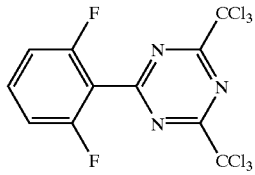
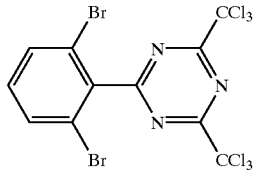
Compounds set forth below, which can be easily synthesized by one skilled in the art according to the synthesis method described in M. P. Hutt, E. F. Elslager and L. M. Werbel, Journal of Heterocyclic Chemistry, Vol. 7 (No. 3), page 511 et seq (1970):
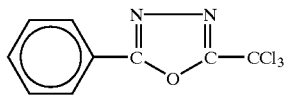
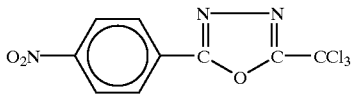
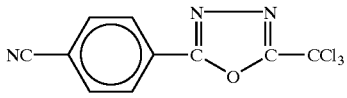
-continued
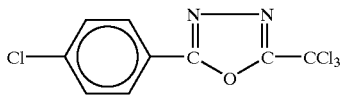
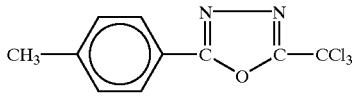
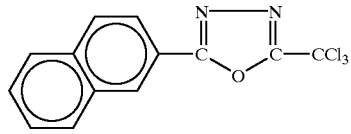
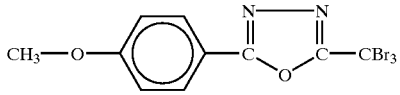
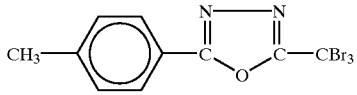
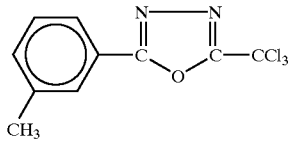
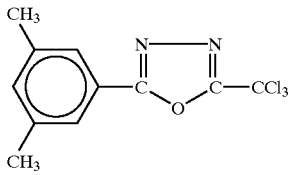
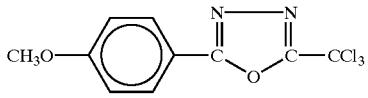
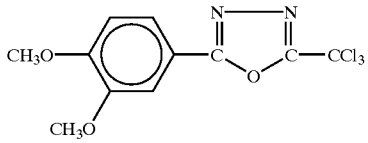
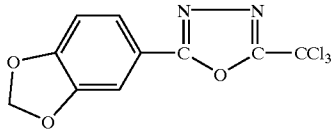
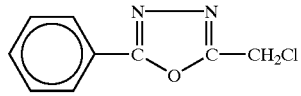
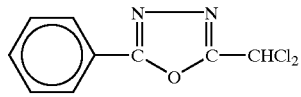
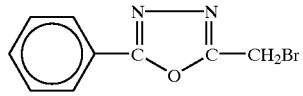
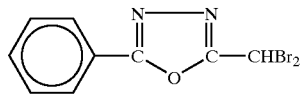
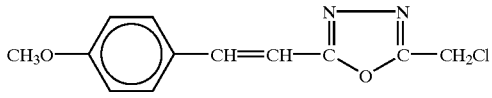

-continued
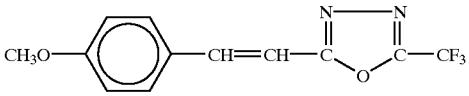
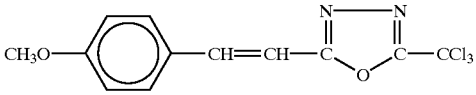
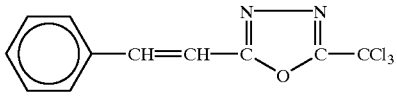
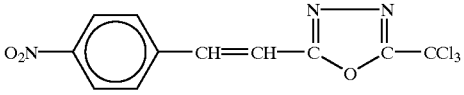
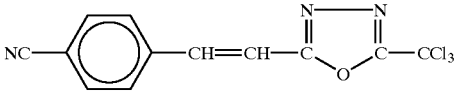
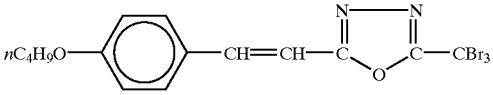
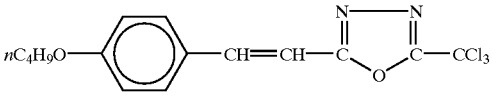
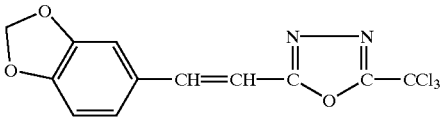
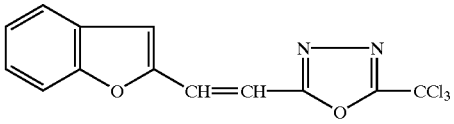
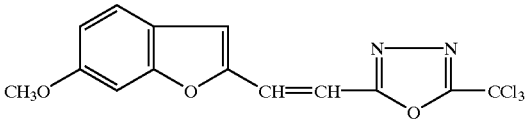
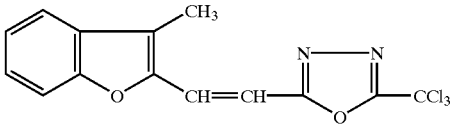
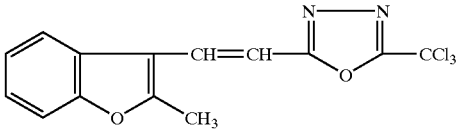
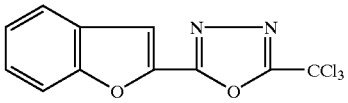
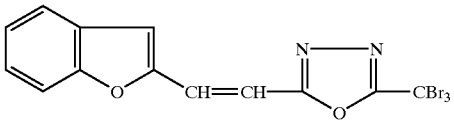
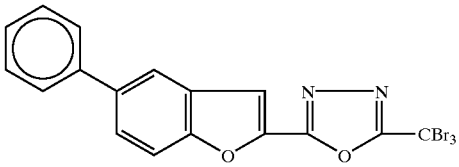
-continued
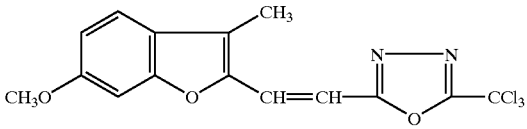
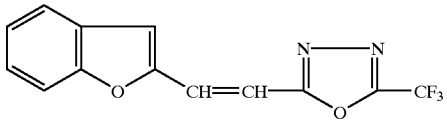
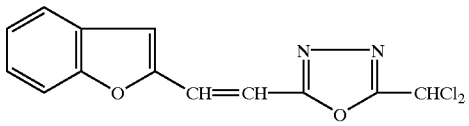
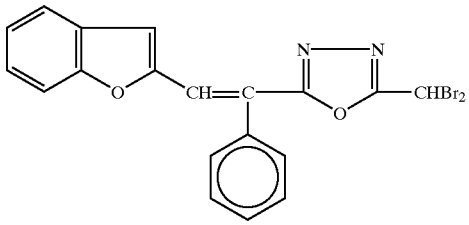
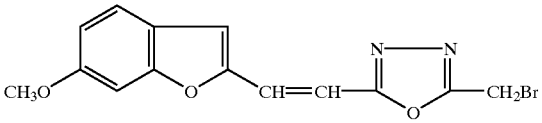
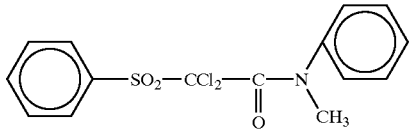
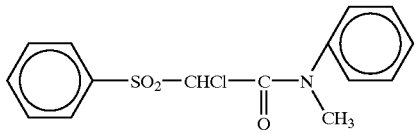
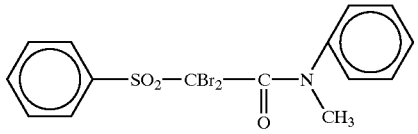
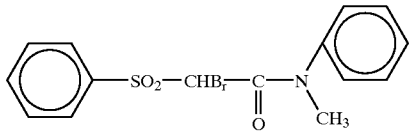
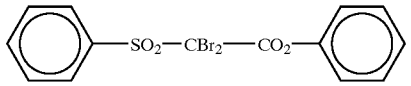
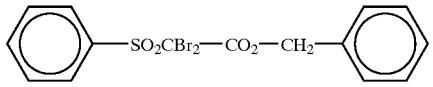
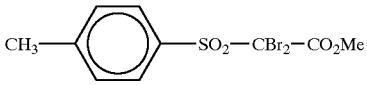
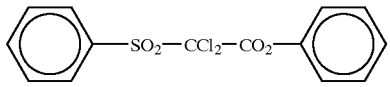
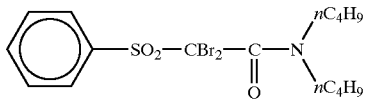

-continued

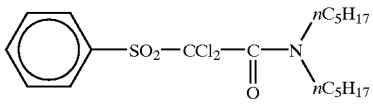

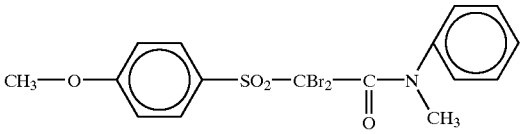

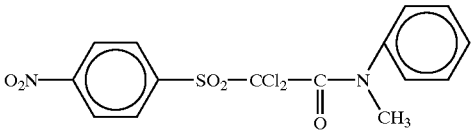

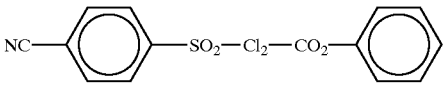

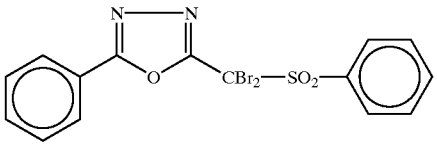

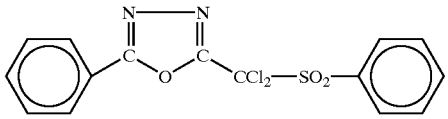

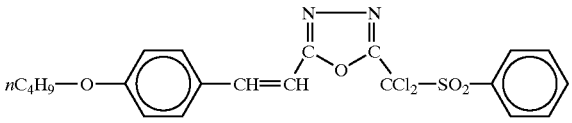

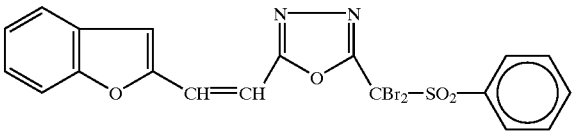

Compounds described in German Patent 2,641,100 such as, for example, 4-(4-methoxystyryl)-6-(3,3,3-trichloropropenyl)-2-pyrone and 4-(3,4,5-trimethoxystyryl)-6-trichloromethyl-2-pyrone;

Compounds described in German Patent 3,333,450, for example as set forth below:

TABLE 1

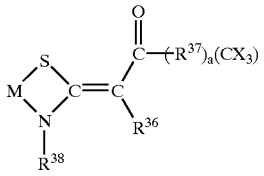

($R^{37}$ = a benzene ring; a = 0 or 1)

| | $R^{38}$ | M | $R^{36}$ | a | $CX_3$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ |

Compounds described in German Patent 3,021,590 as set forth below:

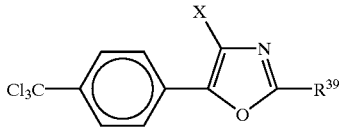

| | $R^{39}$ | X |
|---|---|---|
| 1 | 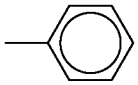 | Cl |
| 2 | 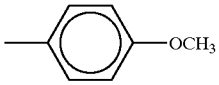 | Cl |
| 4 | 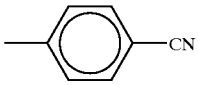 | Cl |

-continued
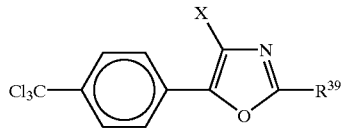
| $R^{39}$ | X |
|---|---|
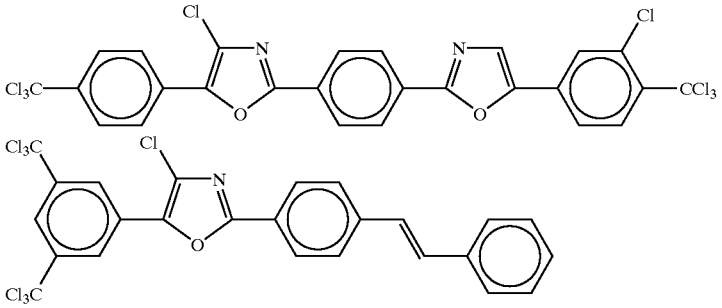
Compounds described in German Patent 3,021,599, for example, as set forth below:
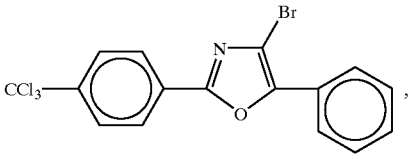
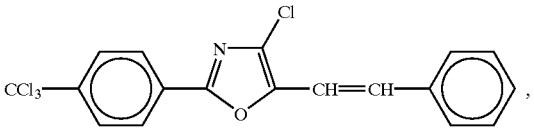
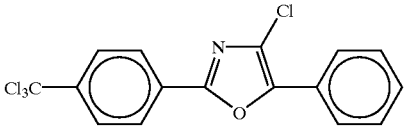
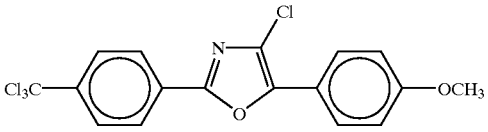
(II-1)
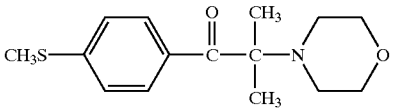
(II-2)
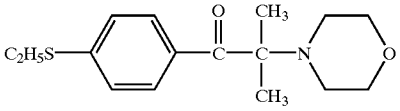
(II-3)
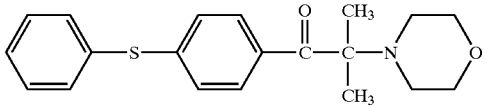
-continued
(II-4)
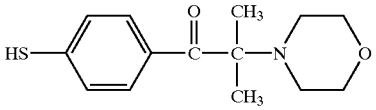
(II-5)
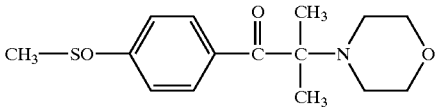
(II-6)
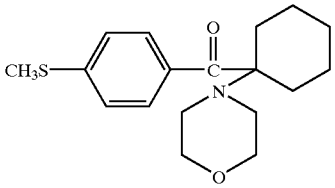
(II-7)
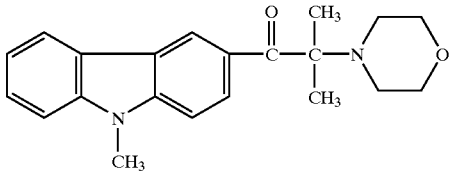
(II-8)
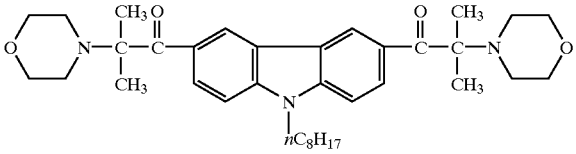
(II-9)
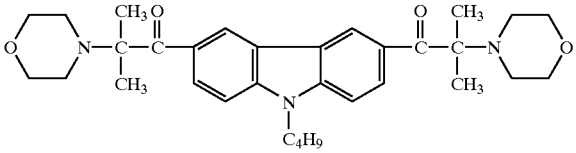

-continued (II-10)

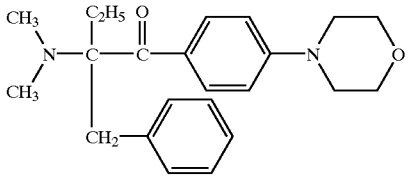

The ketone compound represented by formula (II) as component 2) for use in the present invention is described below. In formula (II), $R^3$ and $R^4$ each represents a hydrogen atom or an alkyl group having from 1 to 8 carbon atoms or $R^3$ and $R^4$ may be combined to represent an alkylene group; $R^5$, $R^6$, $R^7$, $R^8$ and $R^9$ each independently represents a hydrogen atom, a halogen atom, an alkyl group having from 1 to 12 carbon atoms, an alkenyl group having from 3 to 12 carbon atoms, an aryl group, an alkoxy group having from 1 to 12 carbon atoms, a hydroxyl group, an —S—$R^{11}$ group an —SO—$R^{11}$ group or an —$SO_2$—$R^{11}$ group (wherein $R^{11}$ represents an alkyl group or an alkenyl group); and $R^{10}$ represents a hydrogen atom, an alkyl group having from 1 to 12 carbon atoms or an acyl group having from 2 to 13 carbon atoms. The alkyl group, the aryl group, the alkenyl group and the acyl group each may further be substituted by a substituent having from 1 to 6 carbon atoms.

Specific examples of the ketone compound include the following compounds which are described in U.S. Pat. No. 4,318,791 and European Patent 0284561A:

The ketoxime compound represented by formula (III) as component 3) for use in the present invention is described below.

In formula (III), $R^{12}$ and $R^{13}$, which may be the same or different, each represents a hydrocarbon group which may have a substituent and may contain an unsaturated bond, or a heterocyclic ring; $R^{14}$ and $R^{15}$, which may be the same or different, each represents a hydrogen atom, a hydrocarbon group which may have a substituent and may contain an unsaturated bond, a heterocyclic group, a hydroxyl group, a substituted oxy group, a mercapto group or a substituted thio group or $R^{14}$ and $R^{15}$ may be combined with each other to form a ring and represent an alkylene group having from 2 to 8 carbon atoms which may contain —O—, —$NR^{16}$—, —O—CO—, —NH—CO—, —S— and/or —$SO_2$— in the linking main chain of the ring; and $R^{16}$ and $R^{17}$ each represents a hydrogen atom, a hydrocarbon group which may have a substituent and may contain an unsaturated bond or a substituted carbonyl group.

Specific example of the ketooxime compound include the following compounds but the present invention is by no means limited thereto.

(III-1)

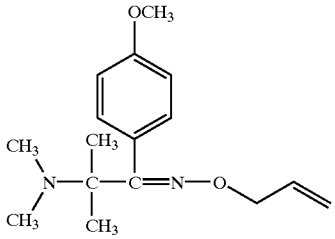

-continued (III-2)

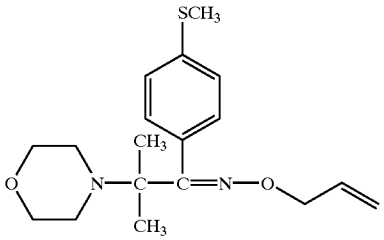

(III-3)

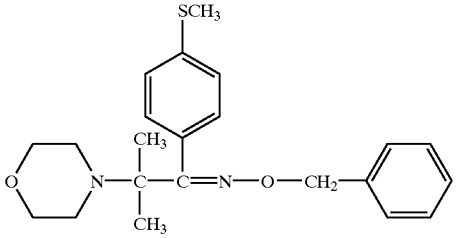

(III-4)

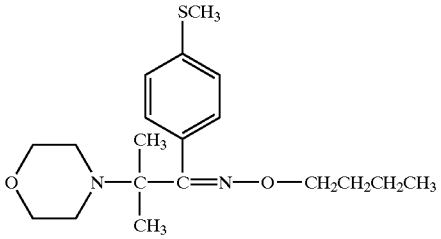

(III-5)

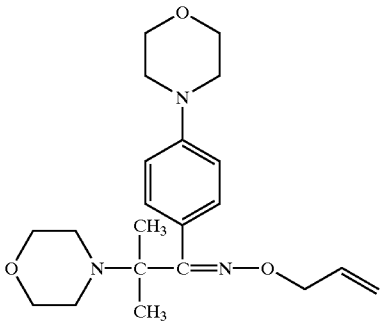

(III-6)

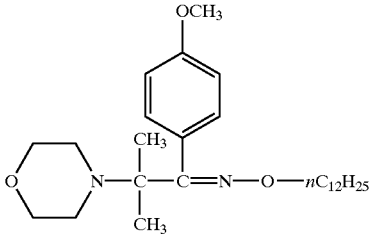

(III-7)

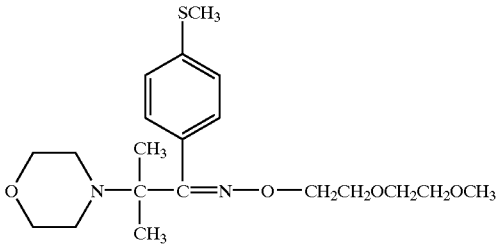

-continued (III-8)

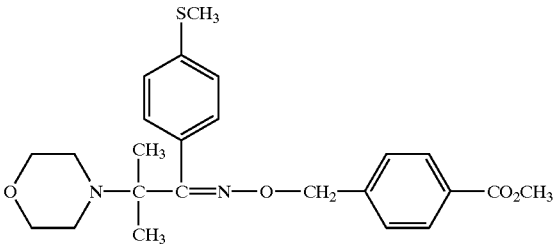

(III-9)

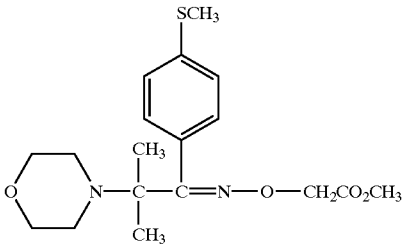

(III-10)

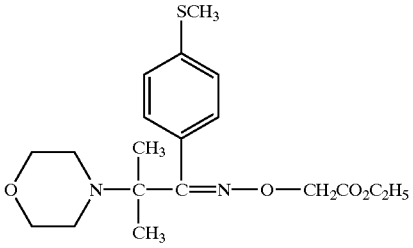

(III-11)

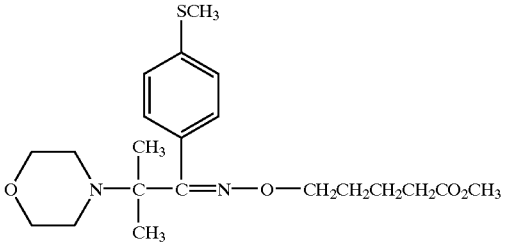

(III-12)

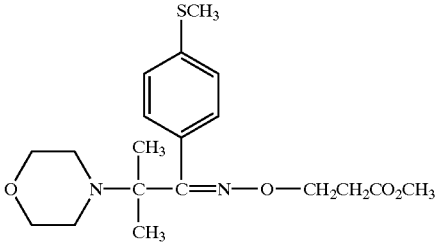

(III-13)

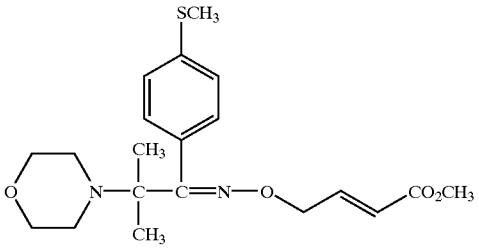

-continued (III-14)

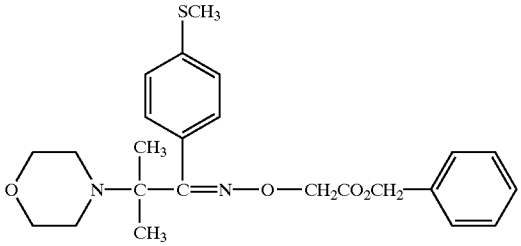

The organic peroxide as component 4) for use in the present invention includes compounds having an oxygen-oxygen bond in the molecule. Examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-dimethyl-2,5-di(tert-butylperoxy) hexine-3, acetyl peroxide, isobutyryl peroxide, octanoyl peroxide, decanoyl peroxide, lauloyl peroxide, 3,5,5-trimethylhexanoyl peroxide, succinic peroxide, benzoyl peroxide, 2,4-dichlorobenzoyl peroxide, metatoluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-butyl peroxybenzoate, di-tert-butyl peroxyisophthalate, 2,5-dimethyl-2,5-di(benzoylperoxy)hexane, tert-butyl peroxy-maleic acid, tert-butyl peroxyisopropylcarbonate, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone, carbonyldi (t-butylperoxy dihydrogen diphthalate) and carbonyldi(t-hexylperoxy dihydrogen diphthalate).

Among these, preferred are peroxide esters such as 3,3',4,4'-terra(t-butylperoxycarbonyl)benzophenone, 3,3',4,4'-tetra(t-amylperoxycarbonyl)benzophenone, 3,3',4,4'tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyl diperoxyisophthalate.

The thio compound as component 5) represented by formula (IV) for use in the present invention is described below.

The alkyl group for $R^{18}$ or $R^{19}$ in formula (IV) is preferably an alkyl group having from 1 to 4 carbon atoms. The aryl group for $R^{18}$ is preferably an aryl group having from 6 to 10 carbon atoms such as phenyl and naphthyl, and the substituted aryl group includes the above-described aryl group substituted by a halogen atom such as chlorine, an alkyl group such as methyl or an alkoxy group such as methoxy or ethoxy.

Specific examples of the thio compound represented by formula (IV) include the compounds shown in the table below.

TABLE 2

| No. | $R^{18}$ | $R^{19}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4—CH_3$ | $C_4H_9$ |
| 10 | $C_6H_4—OCH_3$ | $CH_3$ |
| 11 | $C_6H_4—OCH_3$ | $C_2H_5$ |
| 12 | $C_6H_4—OC_2H_5$ | $CH_3$ |
| 13 | $C_6H_4—OC_2H_5$ | $C_2H_5$ |
| 14 | $C_6H_4—OCH_3$ | $C_4H_9$ |
| 15 | | $—(CH_2)_3—$ |
| 16 | | $—(CH_2)_2—S—$ |
| 17 | | $—CH(CH_3)—CH_2—S—$ |
| 18 | | $—CH_2—CH(CH_3)—S—$ |
| 19 | | $—C(CH_3)_2—CH_2—S—$ |
| 20 | | $—CH_2—C(CH_3)_2—S—$ |
| 21 | | $—(CH_2)_2—O—$ |
| 22 | | $—CH(CH_3)—CH_2—O—$ |
| 23 | | $—C(CH_3)_2—CH_2—O—$ |
| 24 | | $—CH=CH—N(CH_3)—$ |
| 25 | | $—(CH_2)_3—S—$ |
| 26 | | $—(CH_2)_2CH(CH_3)—S—$ |
| 27 | | $—(CH_2)_3—O—$ |
| 28 | | $—(CH_2)_5—$ |
| 29 | | $—C_6H_4—O—$ |
| 30 | | $—N=C(SCH_3)—S—$ |
| 31 | | $—C_6H_4—NH—$ |
| 32 | | 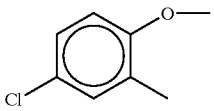 |
| 33 | | 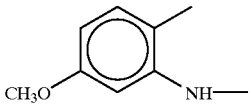 |
| 34 | | 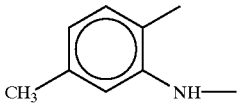 |
| 35 | | 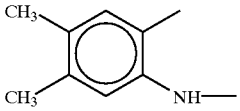 |
| 36 | | 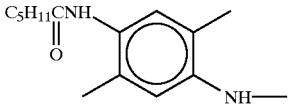 |
| 37 | | 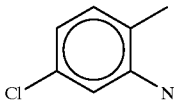 |

TABLE 2-continued

| No. | $R^{18}$ | $R^{19}$ |
|---|---|---|
| 38 | | 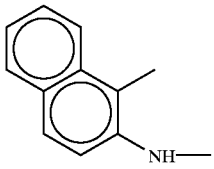 |
| 39 | | 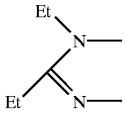 |
| 40 | | 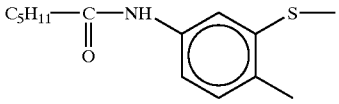 |
| 41 | | 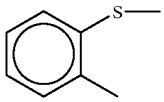 |
| 42 | | 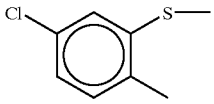 |
| 43 | | 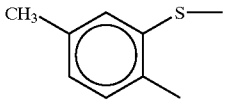 |

Examples of the hexaarylbiimidazole as component 6) for use in the present invention include 2,2'-bis(o-chlorophenyl)-4,4',5,5'-tetraphyenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The aromatic onium salt as component 7) for use in the present invention includes an aromatic onium salt of elements belonging to Groups V, VI and VII of the Periodic Table, specifically, an onium salt of N, P. As, Sb, Bi, O, S, Se, Te and I. Examples of the aromatic onium salt include the compounds described in JP-B-52-14277, JP-B-52-14278 and JP-B-52-14279. Specific examples thereof are set forth below.

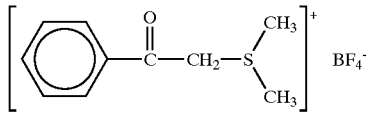

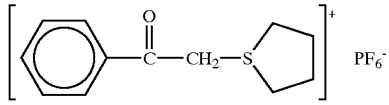

-continued
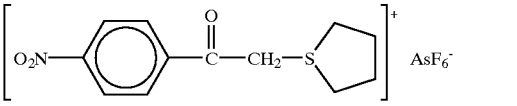
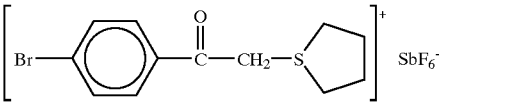
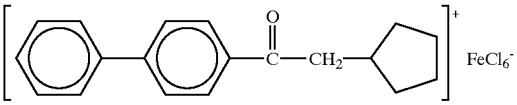
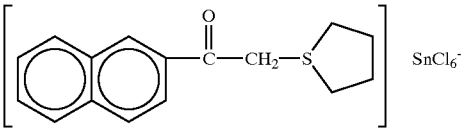
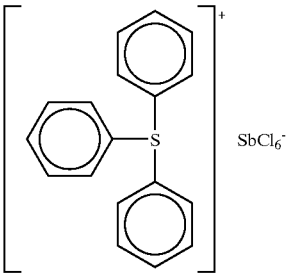
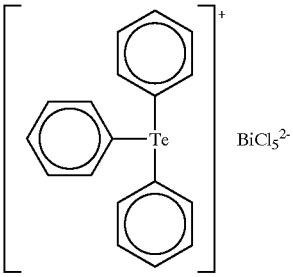
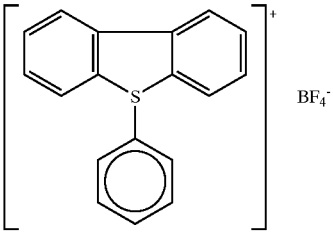
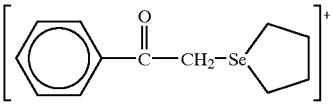
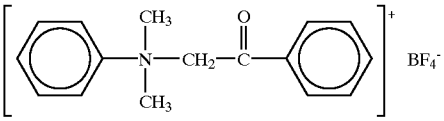
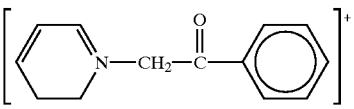
-continued
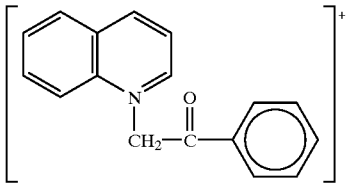
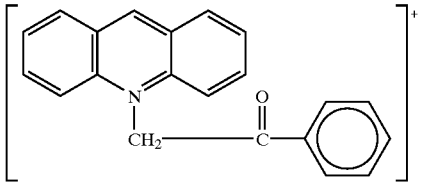
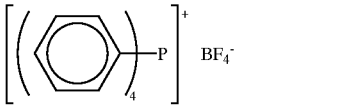
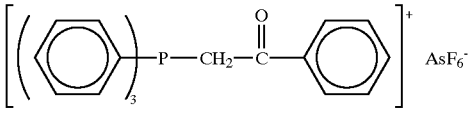
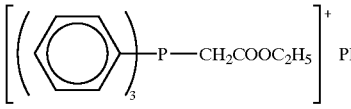
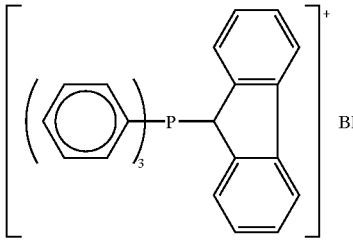
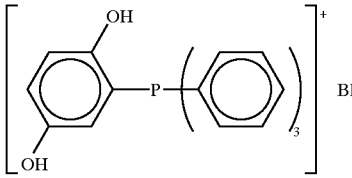
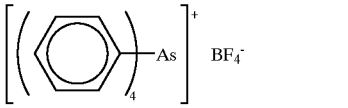
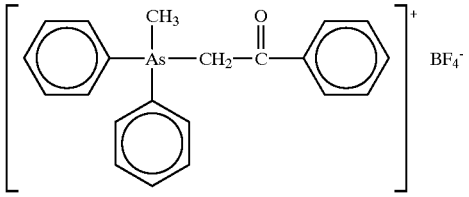
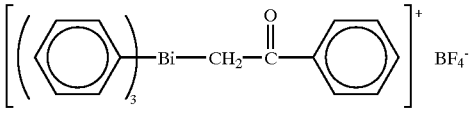
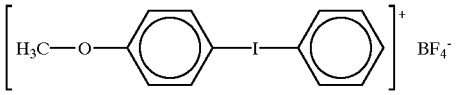

-continued

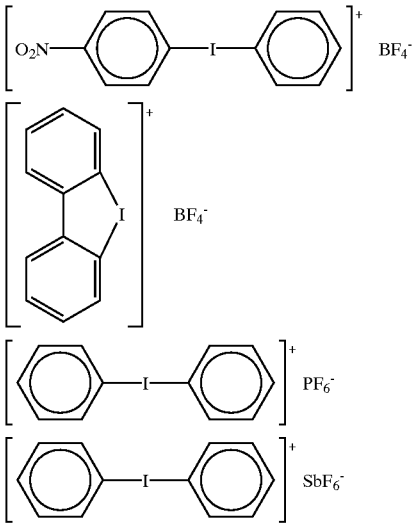

Among these, preferred are compounds of $BF_4$ salt and $PF_6$ salt, more preferred are a $BF_4$ salt and a $PF_6$ salt of aromatic iodonium salts.

Examples of the ketooxime ester as component 8) for use in the present invention include 3-benzoyloxylminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

These additives 1) to 8) may be used individually or in combination of two or more thereof. The use amount in total is suitable from 0.05 to 100 parts by weight, preferably from 1 to 80 parts by weight, more preferably from 3 to 50 parts by weight, per 100 parts by weight of the ethylenic compound.

The composition of the present invention contains the above-described photopolymerization initiation system usually in a very low concentration. If the system is contained in an excessively large concentration, disadvantageous results come out such as cutting of effective light rays. The photopolymerization initiation system of the present invention is preferably used in an amount of from 0.01 to 60% by weight, more preferably for obtaining good results of from 1 to 30% by weight, based on the total amount of the photopolymerizable ethylenically unsaturated compound and a linear organic high molecular polymer which is added according to need.

The photopolymerizable composition of the present invention preferably contains a linear organic high molecular polymer as a binder. The "linear organic high molecular polymer" may be any compound as long as it is a linear organic high molecular polymer having compatibility with the photopolymerizable ethylenically unsaturated compound. Preferably, a water- or weakly alkalescent water-soluble or swellable linear organic high molecular polymer capable of water development or weakly alkalescent water development is selected. The linear organic high molecular polymer is used not only as a film farming agent of the composition but also as a water, weakly alkalescent water or organic solvent developer which is appropriately selected depending on the use. For example, when a water-soluble organic high molecular polymer is used, water development becomes possible. This kind of linear organic high molecular polymer includes an addition polymer having a carboxylic acid group on the side chain and examples thereof include, for example, a methacrylic add copolymer, an acrylic acid copolymer, an itaconic add copolymer, a crotonic add copolymer, a maleic add copolymer and a partially esterified maleic add copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic add group similarly on the side chain is included. An addition product of a cyclic add anhydride to the addition polymer having a hydroxyl group may also be useful.

Among these, a (benzyl (meth)acrylate/(meth)acrylic acid other addition polymerizable vinyl monomer, if desired) copolymer and an (allyl (meth)acrylate/(meth) acrylic add/other addition polymerizable vinyl monomer, if desired) copolymer are preferred. In addition, polyvinyl pyrrolidone and polyethylene oxide are useful as the water-soluble linear organic polymer. Further, an alcohol-soluble polyamide and a polyether of 2,2-bis(4-hydroxyphenyl) propane with epichlorohydrin are also useful to increase the strength of the cured film. The above-described linear organic high molecular polymer can be mixed into the entire composition in any optional amount. However, if the mixing amount exceeds 90% by weight, disadvantageous results may be caused in view of the strength of an image formed and the like. The mixing amount is preferably from 30 to 85% by weight. The weight ratio of the photopolymerizable ethylenically unsaturated compound to the linear organic high molecular polymer is preferably from 1/9 to 7/3, more preferably from 3/7 to 5/5.

In the present invention, in addition to the above-described fundamental components, a slight amount of a thermal polymerization inhibitor is preferably added so as to prevent unnecessary thermal polymerization of the polymerizable ethylenically unsaturated compound during the production or storage of the photosensitive composition. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxyamine primary cerium salt. The addition amount of the thermal polymerization inhibitor is preferably from about 0.01 to about 5% by weight based on the weight of the entire composition. Also, if desired, a higher fatty add derivative such as a behenic add and a behenic add amide may be added and concentrated on the surface of the photosensitive layer during the drying process after coating so as to prevent polymerization inhibition due to oxygen. The addition amount of the higher fatty acid derivative is preferably from about 0.5 to about 10% by weight of the entire composition. Further, a dye or a pigment may be added for the purpose of coloring the photosensitive layer. Examples of the coloring agent include a pigment such as a phthalocyanine pigment, an azo pigment, carbon black and titanium oxide, Ethyl Violet, Crystal Violet, an azo dye, an anthraquinone dye and a cyanine dye. The addition amount of the dye or the pigment is preferably from about 0.5 to about 5% by weight of the entire composition. Also, an inorganic filler or other known additives such as a plasticizer may be added so as to improve physical properties of the cured film.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerine and when a binder is used, the plasticizer may be added in an amount of 10% by weight or less based on the total weight of the ethylenic compound and the binder.

The photopolymerizable composition of the present invention is dissolved in various organic solvents and then coated on a support. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50% by weight.

The coverage of the coating solution in terms of the weight after drying is preferably from about 0.1 to about 10 $g/m^2$, more preferably from 0.5 to 5 $g/m^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film as described in JP-B-48-18327 is preferred, A support having a metal, particularly an aluminum surface is preferably subjected to surface treatment such as graining treatment, dipping treatment in an aqueous solution of sodium silicate, potassium fluorozirconate or phosphate, or anodic oxidation treatment.

An aluminum plate subjected to graining and then to dipping treatment in an aqueous solution of sodium silicate may be preferably used. Further, an aluminum plate subjected to anodic oxidation treatment and then to dipping treatment in an aqueous solution of alkali metal silicate as described in JP-B-47-5125 may be suitably used. The above-described anodic oxidation treatment is carried out by applying current to the aluminum plate as an anode in an electrolyte, for example, is an aqueous or non-aqueous solution of an inorganic acid such as phosphoric acid, chromic acid, sulfuric acid or boric acid or of as organic acid such as oxalic acid or sulfamic acid, which solutions may be used individually or in combination of two or more thereof.

The silicate electrodeposition as described in U.S. Pat. No. 3,658,662 is also effective.

Also, it is useful to apply a surface treatment comprising a combination of the above-described anodic oxidation treatment and sodium silicate treatment to a support subjected to electrolysis Braining as disclosed in JP-B-46-27481, JP-A-52-58602 and JP-A-52-30503.

Further, a support subjected is sequence to mechanical graining chemical etching, electrolysis graining anodic oxidation treatment and sodium silicate treatment as disclosed in JP-A-56-28893 is also preferred Furthermore, a support may be suitably subjected, after the above-described treatments, to undercoating with a water-soluble resin such as a polymer or copolymer having a polyvinyl phosphoric acid or a sulfonic acid on the side chain, a polyacrylic acid, a wares-soluble metal salt (e.g., zinc borate), or a yellow dye or an amine salt.

Still further, a sol-gel treated substrate having conjugation-bonded thereto a functional group capable of addition reaction by radicals as described in JP-A-7-159983 may be used suitably.

The above-described treatments to achieve hydrophilicity are effected not only to reader the support surface hydrophilic but also to prevent harmful reaction of the photopolymerizable composition to be coated on the support and at the same time, to improve the adhesion property of the photosensitive layer.

In order to prevent polymerization inhibition action of the oxygen in air, a protective layer comprising a polymer having an excellent oxygen blocking property, such as polyvinyl alcohol, in particular, polyvinyl alcohol having a saponification degree of 99% or more, or an acidic cellulose, may be provided on the photopolymerizable composition layer on the support. The coating method of the protective layer is described in detail, for example, in U.S. Pat. No. 3,458,311 and JP-A-55-49729.

The photopolymerizable composition of the present invention can be used for usual photopolymerization. Further, the composition can be used in various fields, for example, as a photoresist in producing a printing plate or a printed board. In particular, since the photopolymerizable composition of the present invention has such properties as high sensitivity and wide spectral sensitivity extending even to a visible light region, it can provide good effects when it is applied to a photosensitive material for a visible light laser such as an $Ar^+$ Laser or a YAG-SHG laser.

The photosensitive material using the photopolymerizable composition of the present invention is subjected to image-wise exposure and then the unexposed area of the photosensitive layer is removed by a developer to obtain an image. When the above-described photopolymerizable composition is used in producing a lithographic printing plate, the developer as described in JP-B-57-7427 is preferably used and an aqueous solution of an inorganic alkali agent such as sodium silicate, potassium silicate, sodium hydroxide, potassium hydroxide, lithium hydroxide, sodium tertiary phosphate, sodium hydrogenphosphate, ammonium phosphate, ammonium hydrogenphosphate, sodium metasilicate, sodium bicarbonate or aqueous ammonia or of an organic alkali agent such as monoethanolamine or diethanolamine is suitably used. The alkali agent is added to give a concentration of from 0.1 to 10% by weight, preferably from 0.5 to 5% by weight.

The above-described alkaline aqueous solution may contain, if desired, a surfactant or an organic solvent such as benzyl alcohol, 2-phenoxyethanol as 2-butoxyethanol, in a small amount. Examples thereof include those described in U.S. Pat. Nos. 3,375,171 and 3,615,480.

Further, the developers described in JP-A-50-26601, JP-A-58-54341, JP-B-56-39464 and JP-B-56-42860 are also excellent.

The photopolymerizable composition of the present invention exhibits high sensitivity to active light rays over a wide region of from ultraviolet light to visible light.

Accordingly, the light source which can be used includes an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various laser lamps such as visible and ultraviolet laser lamps, a fluorescent lamp, a tungsten lamp and sunlight.

The present invention will be described below in greater detail by referring to the examples, but the present invention should not be construed as being limited to these examples.

EXAMPLES 1 TO 25 AND COMPARATIVE EXAMPLES 1 TO 6

A 0.30 mm-thick aluminum plate was subjected to graining of the surface thereof using a nylon blush and a water suspension of 400-mesh pumice stones and then well washed with water. After dipping in a 1096 sodium hydroxide at 70° C. for 60 seconds to effect etching, the plate was washed with flowing water, neutralization-washed with a 20% nitric acid and then washed with water. The resulting plate was subjected to electrolysis graining treatment using a sinewaveform alternating current under conditions of $V_A$=12.7 V in a 1% aqueous nitric add solution at an anode electricity quantity of 160 coulomb/dm$^2$. The surface roughness measured was 0.6 $\mu$m (Ra indication). Subsequently, the plate was dipped in a 30% aqueous sulfuric add solution to effect desmutting at 55° C. for 2 minutes and then subjected to anodic oxidation treatment in a 20% aqueous sulfuric add solution at a current density of 2 A/dm$^2$ for 2 minutes to give an anodically oxidized film thickness of 2.7 g/m$^2$.

A photosensitive composition having the following composition was coated on the thus-treated aluminum plate to give a dry coating weight of 1.4 g/m$^2$ and then dried at 80° C. for 2 minutes to form a photosensitive layer.

| | |
|---|---|
| Pentaerythritol tetraacrylate | 1.5 g |
| Allyl methacrylate/methacrylic acid copolymer (copolymerizatin molar ratio: 80/20) | 2.0 g |
| Photopolymerization initiation system | X g |
| Fluorine nonionic surfactant | 0.03 g |
| Methyl ethyl ketone | 20 g |
| Propylene glycol monomethyl ether acetate | 20 g |

On the thus-provided photosensitive layer, a 3 wt % aqueous solution of polyvinyl alcohol (saponification degree: 86.5–89 mol %, polymerization degree: 1,000) was coated to give a dry coating weight of 2 g/m$^2$ and dried at 100° C. for 2 minutes.

The photosensitivity test was conducted to visible light. The visible light used was a monochromatic light from a xenon lamp as a light source through Kenko Optical Filter BP-53.

The photosensitivity was determined using FUJI PS Step Guide (a step tablet having 15 stages, manufactured by Fuji Photo Film Co., Ltd., in which the transmission optical density is 0.05 at the initial stage and increased in sequence by 0.15). The sensitivity was shown by the clear stage number of the PS step guide at the time when exposure was made at the illuminance on the photosensitive layer surface of 0.0132 mW/cm$^2$ for 24 seconds.

Thereafter, the plate was heated at 100° C. for 1 minute and dipped in the following developer at 25° C. for 20 seconds to effect development.

| | |
|---|---|
| 1 K Potassium silicate | 30 g |
| Potassium hydroxide | 15 g |
| $C_{12}H_{25}$—$C_6H_4$—O—$C_6H_4SO_3Na$ | 3 g |
| Water | 1,000 g |

The sensitivity was measured using the following compounds as the photopolymerization initiation system by varying the combination in the system and the results obtained are shown in Table 3. The numerals in parentheses are in a unit of g.

TABLE 3

| Example No. | Sensitizing Dye | Titanocene Compound | Gray Scale Stage Number (Clear) |
|---|---|---|---|
| Example | | | |
| 1 | (ii)-1 (0.08) | A-1 (0.1) | 4 |
| 2 | (ii)-2 (0.08) | A-1 (0.1) | 5 |
| 3 | (ii)-3 (0.08) | A-1 (0.1) | 5 |
| 4 | (ii)-6 (0.08) | A-1 (0.1) | 4 |
| 5 | (ii)-10 (0.08) | A-1 (0.1) | 5 |
| 6 | (ii)-12 (0.08) | A-1 (0.1) | 5 |
| 7 | (ii)-15 (0.08) | A-1 (0.1) | 6 |
| 8 | (ii)-20 (0.08) | A-1 (0.1) | 6 |
| 9 | (ii)-23 (0.08) | A-1 (0.1) | 7 |
| 10 | (ii)-32 (0.08) | A-1 (0.1) | 7 |
| 11 | (ii)-33 (0.08) | A-1 (0.1) | 6 |
| 12 | (ii)-38 (0.08) | A-1 (0.1) | 6 |
| 13 | (ii)-58 (0.08) | A-1 (0.1) | 7 |
| 14 | (ii)-60 (0.03) | A-1 (0.1) | 6 |
| 15 | (ii)-82 (0.08) | A-1 (0.1) | 6 |
| 16 | (ii)-1 (0.08) | A-2 (0.1) | 4 |
| 17 | (ii)-3 (0.08) | A-2 (0.1) | 5 |
| 18 | (ii)-12 (0.08) | A-2 (0.1) | 5.5 |
| 19 | (ii)-23 (0.08) | A-2 (0.1) | 6.5 |
| 20 | (ii)-32 (0.08) | A-2 (0.1) | 6.5 |
| 21 | (ii)-1 (0.08) | A-3 (0.1) | 4.5 |
| 22 | (ii)-3 (0.08) | A-3 (0.1) | 5 |
| 23 | (ii)-12 (0.08) | A-3 (0.1) | 5.5 |
| 24 | (ii)-23 (0.08) | A-3 (0.1) | 7 |
| 25 | (ii)-32 (0.08) | A-3 (0.1) | 6 |
| Comparative Example | | | |
| 1 | (ii)-1 (0.08) | — | 0 |
| 2 | (ii)-12 (0.08) | — | 0 |
| 3 | (ii)-23 (0.08) | — | 0 |
| 4 | — | A-1 (0.1) | 0 |
| 5 | — | A-2 (0.1) | 0 |
| 6 | — | A-3 (0.1) | 0 |

EXAMPLES 26 TO 38

Samples were prepared thoroughly in the same manner as in Example 1 except for changing the photopolymerization initiation system in Example 1 to the compositions describes in Table 4 below and each sample was tested on the sensitivity is the same manner as in Example 1. The results obtained are shown in Table 4 below. The numerals in parentheses are in a unit of g.

TABLE 4

| Example No. | Sensitizing Dye | Titanocene Compound | Compounds 1) to 8) | Gray Scale Stage Number (Clear) |
|---|---|---|---|---|
| 26 | (ii)-23 (0.05) | A-1 (0.1) | 1)-1 (0.1) | 7.5 |
| 27 | (ii)-23 (0.1) | A-1 (0.15) | 1)-2 (0.1) | 7.5 |
| 28 | (ii)-23 (0.08) | A-1 (0.2) | 1)-3 (0.2) | 7.5 |

TABLE 4-continued

| Example No. | Sensitizing Dye | Titanocene Compound | Compounds 1) to 8) | Gray Scale Stage Number (Clear) |
|---|---|---|---|---|
| 20 | (ii)-23 (0.05) | A-1 (0.1) | 2)-1 (0.2) | 8 |
| 30 | (ii)-23 (0.05) | A-1 (0.1) | 2)-7 (0.2) | 8 |
| 31 | (ii)-23 (0.1) | A-1 (0.2) | 3)-6 (0.2) | 8 |
| 32 | (ii)-23 (0.1) | A-1 (0.2) | 3)-9 (0.2) | 7.5 |
| 33 | (ii)-23 (0.05) | A-1 (0.1) | 4)-1 (0.3) | 7.5 |
| 34 | (ii)-23 (0.05) | A-1 (0.1) | 5)-1 (0.4) | 7.5 |
| 35 | (ii)-23 (0.05) | A-1 (0.15) | 5)-2 (0.2) | 8 |
| 36 | (ii)-23 (0.05) | A-1 (0.1) | 7)-1 (0.2) | 7.5 |
| 37 | (ii)-23 (0.05) | A-1 (0.2) | 6)-1 (0.5) | 7.5 |
| 38 | (ii)-23 (0.05) | A-1 (0.1) | 8)-1 (0.2) | 7.5 |
| 39 | (ii)-12 (0.1) | A-1 (0.1) | 1)-1 (0.1) | 7.5 |
| 40 | (ii)-12 (0.05) | A-3 (0.1) | 2)-1 (0.1) | 8 |
| 41 | (ii)-12 (0.05) | A-2 (0.1) | 3)-6 (0.2) | 8 |
| 42 | (ii)-12 (0.1) | A-3 (0.2) | 5)-1 (0.4) | 6 |
| 43 | (ii)-12 (0.1) | A-1 (0.15) | 6)-1 (0.5) | 6 |
| 44 | (ii)-32 (0.1) | A-3 (0.2) | 1)-4 (0.2) | 6 |
| 45 | (ii)-32 (0.1) | A-2 (0.2) | 2)-3 (0.4) | 7 |
| 46 | (ii)-32 (0.05) | A-1 (0.2) | 3)-0 (0.4) | 7.5 |
| 47 | (ii)-32 (0.05) | A-1 (0.1) | 5)-2 (0.3) | 8 |
| 48 | (ii)-32 (0.05) | A-1 (0.1) | 7)-1 (0.2) | 8 |

1)-1: 2-(p-Trifluoromethylphenyl)-4,6-bis(trichloromethyl)-S-triazine
1)-2: 2-Phenyl-4,6-bis(trichloromethyl)-S-triazine
1)-3: 2-Dichloromethyl-5-phenyl-1,3,4-oxadiazole
1)-4: 2-(p-Styrylphenyl)-4,6-bis(trichloromethyl)-S-triazine
2)-1: Compound of formula II-1
2)-3: Compound of formula II-3
2)-7: Compound of formula II-7
3)-6: Compound of formula III-6
3)-9: Compound of formula III-9
4)-1: 3,3',4,4'-Tetra-(t-butylperoxycarbonyl)benophenone
5)-1: 2-Mercaptobenzothiazole
5)-2: 2-Mercapto-5-methoxybenzimidazole
6)-1: 2,2'-Bis(o-chlorophenyl)-4,4',5,5'-tetraphenylbiimidazole
7)-1: Diphenyliodonium hexafluorophosphate
8)-1: 3-Benzoyloxyiminobutan-2-one It is seen from the results in Tables 3 and 4 that the photopolymerizable compositions of the present invention containing a sensitizing dye represented by formula (1) and a titanocene compound as a photopolymerization initiation system showed high sensitivity and those additionally containing at least one of compounds 1) to 8) showed still higher sensitivity.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising an addition-polymerizable compound having at least one ethylenically unsaturated double bond, a sensitizing dye represented by the following formula (1) and a titanocene compound:

(I)

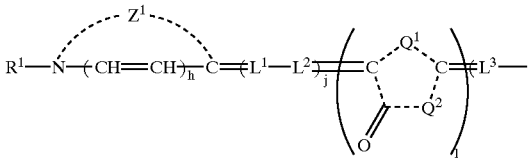

-continued

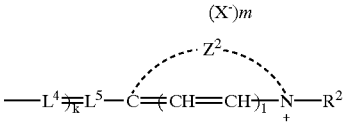

wherein $Z^1$ and $Z^2$ each represents a nonmetallic atom group necessary for forming a 5- or 6-membered nitrogen-containing heterocyclic ring used is cyanine dyes; $R^1$ and $R^2$ each represents an alkyl group; $Q^1$ and $Q^2$ represent in combination therewith an atomic group necessary for forming a 4-thiazolidinone ring, a 5-thiazolidinone ring, a 4-imidazolidinone ring, a 4-oxazolidinone ring, a 5-oxazolidinone ring a 5-imidazolidinone ring or a 4-dithiolanone ring; $L^1$, $L^2$, $L^3$, $L^4$ and $L^5$ each represents a methine group; m represents 1 or 2; i and h each represents 0 or 1; 1 represents 1 as 2; j and k each represents 0, 1, 2 or 3; and $X^-$represents a counter anion.

2. The photopolymerizable composition of claim 1, wherein said addition-polymerizable compound is present in an amount of 5 to 50% by weight based on the entire components.

3. The photopolymerizable composition of claim 1, wherein said sensitizing dye is present in an amount of from 0.05 to 30 parts by weight per 100 parts by weight of said addition-polymerizable compound.

4. The photopolymerizable composition of claim 1, wherein said titanocene compound is present in an amount of from 0.5 to 100 parts by weight per 100 parts by weight of said addition-polymerizable compound.

5. The photopolymerizable composition of claim 1, which further comprises at least one compound selected from the group consisting of the compounds 1) to 8):

1) a compound having a carbon-halogen bond;

2) a ketone compound represented by the following formula (II):

(II)

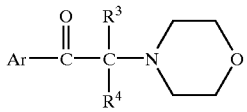

wherein or represents an aromatic group selected from those represented by the following formulae:

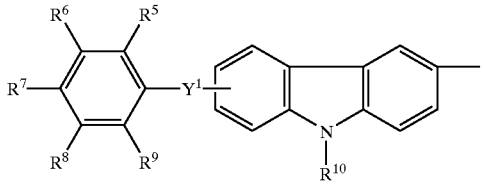

wherein $R^5$, $R^6$, $R^7$, $R^8$, and $R^9$, which are the same or optionally are different, each represents a hydrogen atom, a halogen atom, an alkyl group, as alkenyl group, an aryl group, a substituted aryl group, a hydroxyl group, an alkoxy group, an —S—$R^{11}$ group, an —SO—$R^{11}$ group or an —$SO_2$—$R^{11}$ group, provided that at least one of $R^5$, $R^6$, $R^7$, $R^8$ and $R^9$ represents an —S—$R^{11}$ or —SO—$R^{11}$ group (wherein $R^{11}$ represents an alkyl group or an alkenyl group); $R^{10}$ represents a hydrogen atom, an alkyl group or an acyl group; and $Y^1$ represents a hydrogen atom or

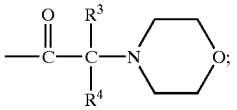

$R^3$ and $R^4$ each represents a hydrogen atom or an alkyl group and $R^3$ and $R^4$ optionally are combined with each other to represent an alkylene group;

3) a ketooxime compound represented by the following formula (III):

(III)

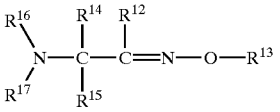

wherein $R^{12}$ and $R^{13}$, which are the same or optionally are different, each represents a hydrocarbon group which optionally has a substituent and optionally contains an unsaturated bond or a heterocyclic group; $R^{14}$ and $R^{15}$, which are the same or optionally are different, each represents a hydrogen atom, a hydrocarbon group which optionally has a substituent and optionally contains an unsaturated bond, a heterocyclic group, a hydroxyl group, a substituted oxy group, a mercapto group or a substituted thio group, and $R^{14}$ and $R^{10}$ optionally are combined with each other to form a ring and represent an alkylene group having from 2 to 8 carbon atoms which optionally contains —O—, —NR—$^{16}$—, —O—CO—, NH—CO—, —S— or —$SO_2$— in the linking main chain of the ring; and $R^{16}$ and $R^{17}$ each represents a hydrogen atom, a hydrocarbon group which optionally has a substituent and optionally contains an unsaturated bond or a substituted carbonyl group;

4) an organic peroxide;

5) a thio compound represented by formula (IV):

(IV)

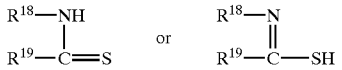

wherein $R^{18}$ represents an alkyl group, an aryl group or a substituted aryl group and $R^{19}$ represents a hydrogen atom or an alkyl group, or $R^{18}$ and $R^{19}$ optionally are combined with each other to represent a nonmetallic atom group necessary for forming a 5-, 6- or 7-membered ring which optionally contains a hetero atom selected from an oxygen atom, a sulfur atom and a nitrogen atom;

6) hexaarylbiimidazole;

7) an aromatic opium salt; and 8) a ketooxime ester.

6. The photopolymerizable composition of claim 5, wherein said compounds 1) to 8) are present in a total amount of 0.05 to 100 parts by weight per 100 parts by weight of said addition-polymerizable compound.

* * * * *